(12) United States Patent
Nishijima

(10) Patent No.: US 9,048,825 B2
(45) Date of Patent: *Jun. 2, 2015

(54) SEMICONDUCTOR DEVICE

(71) Applicant: Semiconductor Energy Laboratory Co., Ltd., Kanagawa-ken (JP)

(72) Inventor: Tatsuji Nishijima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/211,426

(22) Filed: Mar. 14, 2014

(65) Prior Publication Data
US 2014/0197873 A1    Jul. 17, 2014

Related U.S. Application Data

(63) Continuation of application No. 13/473,807, filed on May 17, 2012, now Pat. No. 8,674,738.

(30) Foreign Application Priority Data

May 20, 2011   (JP) .................................. 2011-113995

(51) Int. Cl.
  *H03K 3/356*   (2006.01)
  *H03K 19/0175*   (2006.01)
  *G11C 19/28*   (2006.01)
  *H03K 19/0185*   (2006.01)

(52) U.S. Cl.
  CPC ............ *H03K 19/0175* (2013.01); *G11C 19/28* (2013.01); *H03K 19/018507* (2013.01)

(58) Field of Classification Search
  USPC ......... 327/199, 202, 203, 208, 210–212, 215, 327/218, 219, 225, 333
  See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,845,032 B2 | 1/2005 | Toyoda et al. |
| 6,980,459 B2 | 12/2005 | Seshadri et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Long Nguyen
(74) *Attorney, Agent, or Firm* — Husch Blackwell LLP

(57) ABSTRACT

An object of one embodiment of the present invention to provide a latch circuit includes a level shifter and a buffer in which transistors each including a channel region formed in an oxide semiconductor film are connected in series. Thus, data can be held in the latch circuit even when power is not supplied.

21 Claims, 24 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,179,178 B2* | 5/2012 | Lundberg .................. 327/208 |
| 8,674,738 B2* | 3/2014 | Nishijima .................. 327/208 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0063014 A1 | 3/2011 | Koyama et al. |
| 2011/0101942 A1 | 5/2011 | Yamazaki et al. |
| 2011/0242070 A1 | 10/2011 | Yamazaki et al. |
| 2012/0293231 A1* | 11/2012 | Nishijima .................. 327/333 |
| 2012/0294096 A1* | 11/2012 | Nishijima .................. 365/189.11 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO 2004/059838 A1 | 7/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Flim Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

(56) References Cited

OTHER PUBLICATIONS

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest.'08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorescent Organic Light-Emiting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure For Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW'06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N et al., "Spinel,YBFE2O4, and YB2FE3O7 Types of Structures for Compounds in the In2O3 and Sc2O3—A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B) 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci.Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner c-axis direction

Electric charge 0

Electric charge +1

Electric charge 0 a-b plane

Electric charge −1

Electric charge 0

● In
○ Sn
○ Zn
● O

● In
○ Ga
○ Zn
● O

● In
○ Ga or Zn
● O

● In
○ Ga
○ Zn
● O

SEMICONDUCTOR DEVICE

This application is a continuation of U.S. application Ser. No. 13/473,807, filed on May 17, 2012, now U.S. Pat. No. 8,674,738.

BACKGROUND OF THE INVENTION

1. Field of the Invention

The present invention relates to a latch circuit, a flip-flop circuit including the latch circuit, and a semiconductor device including the flip-flop circuit.

2. Description of the Related Art

A semiconductor device such as a large-scale integrated circuit (LSI) is constituted by a logical gate that is a circuit processing a digital logical value and a circuit which temporarily holds the digital logical value. Typical examples of the logical gate include an inverter, an AND, an OR, a NOR, and a NAND. Further, typical examples of the circuit which temporarily holds a digital logical value include a latch circuit and a flip-flop circuit.

In recent years, a semiconductor device which consumes less power while keeping the processing speed at the same level as conventional semiconductor devices has been required. There is a known method in which power consumption is reduced by stopping supplying power to a circuit which is not driven or the whole semiconductor device.

However, by this method, data which has been held in a volatile latch circuit or flip-flop circuit is erased even when supply of power is restarted after power shutdown. To solve the problem, there is a backup method in which in order to hold data reliably while power is not supplied, data is written to a nonvolatile memory element that operates at low speed immediately before supplying power is stopped, and a latch circuit, a flip-flop circuit, or the like is driven while power is supplied to the semiconductor device.

Further, a latch circuit which is nonvolatilized (nonvolatile latch circuit) including a ferroelectric capacitor has been proposed in order to hold data by a latch circuit even in a state where power is not supplied (see Patent Document 1).

REFERENCE

[Patent Document 1] PCT International Publication No. 2004/059838

SUMMARY OF THE INVENTION

However, the backup method has problems in that power consumed before power shutdown and after resumption of supplying power is increased in the case where a large amount of data is held by the latch circuit, a flip-flop circuit, or the like because it takes a long time to make a backup of data.

On the other hand, a volatile latch circuit in which a nonvolatile memory element including a ferroelectric capacitor or the like is provided has a problem such as high manufacturing cost and low writing speed.

Thus, an object of one embodiment of the present invention is to provide a semiconductor device which can operate at high speed and consumes less power.

One embodiment of the present invention includes a latch circuit which includes a level shifter, a first buffer, a second buffer, a first switch and a second switch which output one of two input signals to the outside, a first terminal, a second terminal which receives an inverted signal of a signal input to the first terminal, and a third terminal to which a clock signal for controlling states of the first switch and the second switch is input. A first output terminal of the level shifter is connected to one of input terminals of each of the first buffer and the second buffer via the first switch, and a second output terminal of the level shifter is connected to the other input terminal of each of the first buffer and the second buffer via the second switch. A first input terminal of the level shifter is connected to an output terminal of the first buffer, and a second input terminal of the level shifter is connected to an output terminal of the second buffer. A third input terminal of the level shifter is connected to the first output terminal of the level shifter via the first switch, and a fourth input terminal of the level shifter is connected to the second output terminal of the level shifter via the second switch.

Another embodiment of the present invention includes a latch circuit which includes a level shifter, a first buffer, a second buffer, a first switch, a second switch, a first terminal, a second terminal which receives an inverted signal of a signal input to the first terminal, and a third terminal to which a clock signal for controlling states of the first switch and the second switch is input. The level shifter includes a first input terminal, a second input terminal which receives an inverted signal of an input signal input to the first input terminal, a third input terminal, a fourth input terminal which receives an inverted signal of an input signal input to the third input terminal, a first output terminal, and a second output terminal from which an inverted signal of an output signal output from the first output terminal is output. The first buffer includes a fifth input terminal, a sixth input terminal which receives an inverted signal of an input signal input to the fifth input terminal, and a third output terminal. The second buffer includes a seventh input terminal, an eighth input terminals which receives an inverted signal of an input signal input to the seventh input terminal, and a fourth output terminal. The first output terminal is connected to the third input terminal, the sixth input terminal, and the seventh input terminal via the first switch, and the second output terminal is connected to the fourth input terminal, the fifth input tetminal, and the eighth input terminal via the second switch. The first input terminal is connected to the fourth output terminal, and the second input terminal is connected to the third output terminal.

Note that a piece of data is held in a first node where the third output terminal of the first buffer and the second input terminal of the level shifter are connected, and a piece of data is held in a second node where the fourth output terminal of the second buffer and the first input terminal of the level shifter are connected. In each of the first buffer and the second buffer, transistors in each of which a channel region is formed in an oxide semiconductor film are connected in series.

Another embodiment of the present invention includes a latch circuit which includes a level shifter, a first buffer, a second buffer, a first switch, a second switch, a first terminal, a second switch which receives an inverted signal of a signal input to the first terminal, and a third terminal to which a clock signal for controlling states of the first switch and the second switch is input. The first buffer includes a first transistor and a second transistor which are connected in series. The second buffer includes a third transistor and a fourth transistor which are connected in series. The level shifter includes a fifth transistor and a sixth transistor which are connected in series, and a seventh transistor and an eighth transistor which are connected in series. A connection portion of one of a source and a drain of the fifth transistor and one of a source and a drain of the sixth transistor is connected to gates of the second transistor, the third transistor, and the seventh transistor via the first switch which controls input of a first signal. A connection portion of one of a source and a drain of the seventh transistor and one of a source and a drain of the eighth transistor is connected to gates of the first transistor, the fourth transistor, and the fifth transistor via the second switch which controls input of a second signal that is an inverted signal of the first signal. A gate of the sixth transistor is connected to a connection portion of one of a source and a drain of the first transistor and one of a source and a drain of the second transistor. A gate of the eighth transistor is connected to a connection portion of one of a source and a drain of the third transistor and one of a source and a drain of the fourth transistor.

Note that the first to fourth transistors are each a transistor in which a channel region is farmed in an oxide semiconductor film, the fifth transistor and the seventh transistor are p-channel transistors, and the sixth transistor and the eighth transistor are n-channel transistors.

Another embodiment of the present invention includes a latch circuit which includes a level shifter, a first buffer, a second buffer, a first switch, a second switch, a first terminal, a second terminal which receives an inverted signal of a signal input to the first terminal, and a third terminal to which a clock signal for controlling states of the first switch and the second switch is input. The first buffer includes a first transistor and a second transistor which are connected in series. The second buffer includes a third transistor and a fourth transistor which are connected in series. The level shifter includes a fifth transistor, a sixth transistor, and a seventh transistor which are connected in series, and an eighth transistor, a ninth transistor, and a tenth transistor which are connected in series. A connection portion of one of a source and a drain of the sixth transistor and one of a source and a drain of the seventh transistor is connected to gates of the second transistor, the third transistor, and the eighth transistor via the first switch which controls input of a first signal. A connection portion of one of a source and a drain of the ninth transistor and one of a source and a drain of the tenth transistor is connected to gates of the first transistor, the fourth transistor, and the fifth transistor via a second switch which controls input of a second signal that is an inverted signal of the first signal. Gates of the sixth transistor and the seventh transistor are connected to a connection portion of one of a source and a drain of the first transistor and one of a source and a drain of the second transistor. Gates of the ninth transistor and the tenth transistor are connected to a connection portion of one of a source and a drain of the third transistor and one of a source and a drain of the fourth transistor.

Note that the first to fourth transistors are each a transistor in which a channel region is formed in an oxide semiconductor film; the fifth transistor, the sixth transistor, the eighth transistor, and the ninth transistor are p-channel transistors; and the seventh transistor and the tenth transistor are n-channel transistors.

In the above latch circuit, a first period during which the first signal is input from the first terminal and the second signal is input from the second signal, and a second period during which the first signal is output from the first output terminal and the second signal is output from the second output terminal are controlled by the clock signal.

In the above latch circuit, data is held in a node where an output terminal (one of the source and the drain of the transistor) of the buffer and an input terminal (the gate of the transistor) of the level shifter are connected. The buffer is formed using a transistor which includes a channel region in an oxide semiconductor film and has an extremely small amount of leakage current. Thus, even after supply of the power supply voltage is stopped, the voltage of the node can be held for a long time. That is, the latch circuit is a nonvolatile latch circuit.

Further, the first switch and the second switch have functions of outputting signals input from the first terminal and the second terminal, writing data to the latch circuit, and outputting data held by the latch circuit to the outside. Writing data operation and reading data operation are alternately conducted in accordance with a clock signal input from the third terminal. In other words, the latch circuit has a writing function and a reading function. Thus, the feedback potential in the latch circuit can be switched to an output potential from the level shifter or an externally input potential (typically, from the first terminal and the second terminal) by the clock signal input from the third terminal.

Further, even when the potential of the node fluctuates due to the long stop of supplying power, the potential of the node is easily refreshed; thus, malfunction of data holding can be reduced.

Further, in the case where power starts to be supplied after the stop of supplying power, the backup of data in the semiconductor device is not needed. Therefore, immediate power shutdown and restoring data at high speed after start of supplying power are possible in a semiconductor device, and accordingly power consumption can be reduced.

Further, in a semiconductor device, supplying power to a latch circuit to/from which data is not written/read can be selectively stopped. Thus, power consumption of a semiconductor device can be reduced.

A latch circuit includes a transistor with a channel region formed in an oxide semiconductor film and a transistor which includes a semiconductor substrate or a semiconductor film provided over an insulating substrate and is connected to the transistor with an oxide semiconductor film. The transistor with a channel region formed in an oxide semiconductor film can be stacked over the transistor with a semiconductor substrate or a semiconductor film provided over an insulating substrate, and as a result, high integration of the semiconductor device is achieved.

According to one embodiment of the present invention, a latch circuit includes a level shifter and a buffer in which transistors each including a channel region formed in an oxide semiconductor film are connected in series; thus, data can be held in the latch circuit even when power is not supplied. Therefore, the starting time can be shortened and the power consumption can be reduced. Further, in the latch circuit, the level shifter is formed using a transistor which includes a semiconductor substrate or a semiconductor film provided over an insulating substrate, and over the level shifter, the buffer is formed using a transistor in which a channel region is formed in an oxide semiconductor film. In other words, the level shifter and the buffer can be stacked, which enables high integration.

DETAILED DESCRIPTION OF THE INVENTION

Figure 1:
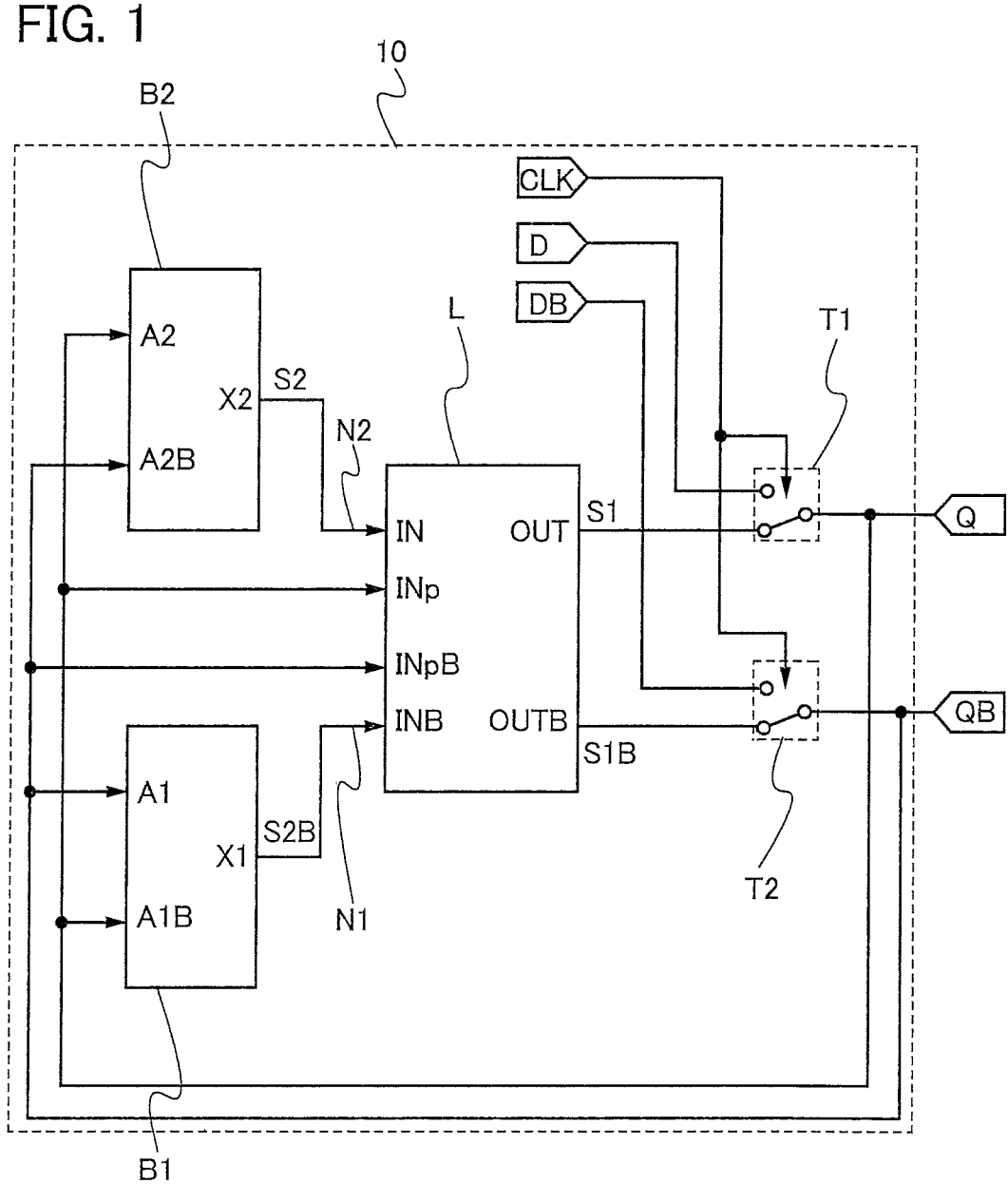
FIG. 1 is a block diagram showing a latch circuit according to one embodiment of the present invention.

Embodiments of the present invention will be described below with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the following description.

Note that functions of the "source" and "drain" may be switched in the case where transistors of different polarities are employed or in the case where the direction of a current flow changes in a circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on the object having any electric function as long as electric signals can be transmitted and received between the components connected through the object.

In addition, even when a circuit diagram shows independent components as if they are electrically connected to each other, there is actually a case where one conductive film has functions of a plurality of components such as a case where part of a wiring also functions as an electrode. The "electrical connection" in this specification includes in its category such a case where one conductive film has functions of a plurality of components.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

(Embodiment 1)

One embodiment of a latch circuit included in a semiconductor device will be described with reference to FIG. 1, FIG. 2, and FIG. 3. Here, as a latch circuit, a D(Data) latch circuit is used for description.

FIG. 1 is a block diagram showing a latch circuit described in this embodiment.

A latch circuit 10 shown in this embodiment includes a level shifter L, a buffer B1, a buffer B2, a switch T1, and a switch T2. Further, the latch circuit includes a first terminal D, a second terminal DB, and a third terminal CLK to which a clock signal for controlling the switch T1 and the switch T2 is input. To the second terminal DB, an inverted signal of a signal input to the first terminal D is input. Further, an output terminal Q connected to the switch T1 and an output terminal QB connected to the switch T2 are provided. From the output terminal QB, an inverted signal of a signal output from the output terminal Q is output.

The level shifter L includes a first input terminal IN, a second input terminal INB, a third input terminal INp, a fourth input terminal INpB, a first output terminal OUT, and a second output terminal OUTB. To the second input terminal INB, an inverted signal of a signal input to the first input terminal IN is input. To the fourth input terminal INpB, an inverted signal of a signal input to the third input terminal INp is input. From the first output terminal OUT, a signal S1 is output. From the second output terminal OUTB, an inverted signal S1B that is an inverted signal of the signal S1 is output. To the third input terminal INp, the signal S1 output from the first output terminal OUT of the level shifter L is input. To the fourth input terminal INpB, the inverted signal S1B that is an inverted signal of the signal S1 and output from the second output terminal OUTB of the level shifter L is input.

The buffer B2 includes a first input terminal A2, a second input terminal A2B, and an output terminal X2. To the first input terminal A2, the signal S1 output from the first output terminal OUT of the level shifter L is input. To the second input terminal A2B, the inverted signal S1B that is an inverted signal of the signal S1 and output from the second output terminal OUTB of the level shifter L is input. From the output terminal X2, a signal S2 is output, and the signal S2 is input to the first input terminal IN of the level shifter L. Note that the signal S2 has the same logical value (e.g., High (1)) as the signal S1.

The buffer B1 includes a first input terminal A1, a second input terminal A1B, and an output terminal X1. To the first input terminal A1, the inverted signal S1B that is an inverted signal of the signal 51 and output from the second output terminal OUTB of the level shifter L is input. To the second input terminal A1B, the signal S1 output from the first output terminal OUT of the level shifter L is input. From the output terminal X1, an inverted signal S2B that is an inverted signal of the signal S2 is output, and the inverted signal S2B is input to the second input terminal INB of the level shifter L. Note that the signal S2B has the same logical value (e.g., Low (0)) as the signal S1B.

In each of the buffer B1 and the buffer B2, n-channel transistors with an extremely small amount of off-state current are connected in series, and the output terminal (X1 and X2) is formed at a connection portion of one of a source and a drain of one of the n-channel transistors and one of a source and a drain of the other n-channel transistor. The transistor with a small amount of off-state current is a transistor in which a channel region is formed using a semiconductor film with a wide energy gap (e.g., 2 eV or more, preferably 2.5 eV or more, further preferably 3 eV or more). Typically, a transistor in which a channel region is formed using an oxide semiconductor film, silicon carbide, gallium nitride, or the like can be given as an example.

An input terminal of the switch T1 is connected to the first terminal D or the first output terminal OUT of the level shifter L. An input terminal of the switch T2 is connected to the second terminal DB or the second output terminal OUTB of the level shifter L.

Connection of the switch T1 to the first terminal D or the first output terminal OUT of the level shifter L is controlled by a CLK signal input from the third terminal CLK. Connection of the switch T2 to the second terminal DB or the second output terminal OUTB of the level shifter L is controlled by a CLK signal input from the third terminal CLK. Note that a CLK signal is input to the switch T1 and the switch T2 from the third terminal.

Each of the switches T1 and T2 is formed with one or more of an AND circuit, a NAND circuit, an OR circuit, and a NOR circuit. Alternatively, each of the switches T1 and T2 is a transmission gate.

Each of the switches T1 and T2 has functions of outputting a signal that is externally input (typically, from the first terminal D and the second terminal DB) to the outside, writing data to the latch circuit, and outputting data held in the latch circuit to the outside. In addition, data writing and data reading are alternately conducted in accordance with a clock signal input from the third terminal CLK. In other words, the latch circuit described in this embodiment has a writing function and a reading function. Thus, with use of a CLK signal, a feedback potential of the latch circuit 10 can be switched to an output potential from the level shifter or an externally input potential (typically, from the first terminal D and the second terminal DB).

In the latch circuit 10 described in this embodiment, first data is held by adjusting a potential (or the amount of charge corresponding to the potential) at a connection portion (node N2) of the output terminal X2 of the buffer B2 and the first input terminal IN of the level shifter L in accordance with data. In addition, second data that is inverted data of the first data is held by adjusting a potential (or the amount of charge corresponding to the potential) at a connection portion (node N1) of the output terminal X1 of the buffer B1 and the second input terminal INB of the level shifter L in accordance with data. For example, 1-bit data can be stored when a state in which a predetermined potential is held at the node N2 corresponds to "1" and a state in which potential is not held at the node N1 corresponds to "0"

In each of the buffer B1 and the buffer B2, the transistors each of which includes a channel region formed in an oxide semiconductor film and has an extremely small off-state current are connected in series. Further, each of the output terminal X1 of the buffer B1 and the output terminal X2 of the buffer B2 is the connection portion of one of a source and a drain of one of the n-channel transistors with an extremely small amount of off-state current and one of a source and a drain of the other n-channel transistor. At the connection portions, potentials of the input terminals of the level shifter L are controlled. Thus, even when power is not supplied, the first data and the second data can be held, and as a result, the latch circuit 10 functions as a nonvolatile latch circuit.

Further, some of signals output from the level shifter L are input to the level shifter L through the buffers B1 and B2 when the switches T1 and T2 are connected to the first output terminal OUT and the second output terminal OUTB, respectively; accordingly, the output data of the level shifter L is fed back. Even if the potentials held at the node N1 and the node N2 fluctuate due to the long stop of supplying power, by the feedback, the potentials of the node N1 and the node N2 can be refreshed when the power is supplied, and thus change in data of the latch circuit 10 can be reduced.

Hereinafter, the writing of data to the latch circuit 10 and the reading of data held in the latch circuit 10 are described.
<Writing of Data>

By a CLK signal (e.g., High), the first terminal D and the output terminal Q are connected via the switch T1, and the second terminal DB and the output terminal QB are connected via the switch T2.

A signal input from the first terminal D is output from the output terminal Q and also input to the level shifter L, the buffer B1, and the buffer B2. A signal input from the second terminal DB is output from the output terminal QB and also input to the level shifter L, the buffer B1, and the buffer B2. As a result, first data is held in the output terminal X2 of the buffer B2 and the first input terminal IN of the level shifter L, that is, the node N2. Further, second data that is inverted data of the first data held in the node N2 is held in the output terminal X1 of the buffer B1 and the second input terminal INB of the level shifter L, that is, the node N1.
<Holding of Data>

Since the latch circuit 10 has nonvolatility, data can be held in the nodes N1 and N2 even when power supply of a semiconductor device is stopped.
<Reading of Data>

By a CLK signal (e.g., Low), the first output terminal OUT of the level shifter L and the output terminal Q are connected via the switch T1, and the second output terminal OUTB of the level shifter L and the output terminal QB are connected via the switch T2.

As a result, one of the first data held in the node N2 and the second data held in the node N1 is output to one of the output terminal Q and the output terminal QB, and the other of the first data held in the node N2 and the second data held in the node N1 is output to the other of the output terminal Q and the output terminal QB. Accordingly, data held in the latch circuit 10 can be read out.

Therefore, the latch circuit 10 described in this embodiment is a nonvolatile latch circuit having a writing function.

Next, a specific circuit configuration of the latch circuit 10 shown in FIG. 1 is described with reference to FIG. 2 and FIG. 3.

Figure 2:
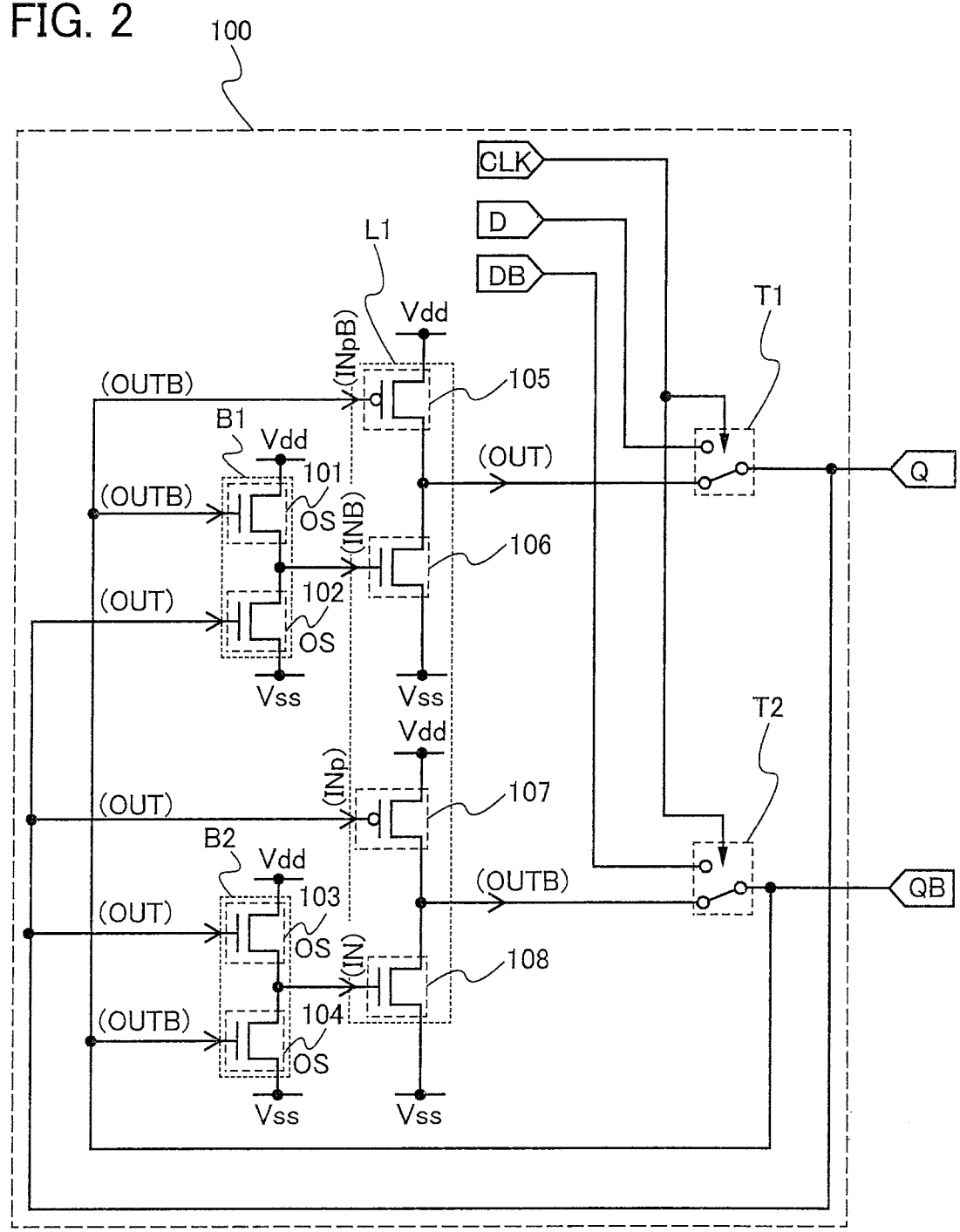
FIG. 2 is a circuit diagram showing a latch circuit according to one embodiment of the present invention.

FIG. 2 is a circuit diagram of one mode of a latch circuit 100. The latch circuit 100 includes a buffer B1 including a first transistor 101 and a second transistor 102 connected in series, a buffer B2 including a third transistor 103 and a fourth transistor 104 connected in series, and a level shifter L1. The level shifter L1 includes a fifth transistor 105 and a sixth transistor 106 connected in series, and a seventh transistor 107 and an eighth transistor 108 connected in series.

In addition, a first terminal D, a second terminal DB, and a third terminal CLK to which a clock signal for controlling states of a switch T1 and a switch T2 are provided. Note that to the second terminal DB, an inverted signal of a signal input to the first terminal D is input. In addition, an output terminal Q connected to the switch T1 and an output terminal QB connected to the switch T2 are provided. Note that from the output terminal QB, an inverted signal of a signal output from the output terminal Q is output.

In the buffer B1, one of a source and a drain of the first transistor 101 and one of a source and a drain of the second transistor 102 are connected. This connection portion corresponds to an output terminal of the buffer B1.

In the buffer B2, one of a source and a drain of the third transistor 103 and one of a source and a drain of the fourth transistor 104 are connected. This connection portion corresponds to an output terminal of the buffer B2.

In the level shifter L1, one of a source and a drain of the fifth transistor 105 and one of a source and a drain of the sixth transistor 106 are connected. This connection portion corresponds is a first output terminal OUT of the level shifter L1.

In the level shifter L1, one of a source and a drain of the seventh transistor 107 and one of a source and a drain of the eighth transistor 108 are connected. This connection portion corresponds is a second output terminal OUTB of the level shifter L1.

The other of the source and the drain of each of the first transistor 101, the third transistor 103, the fifth transistor 105, and the seventh transistor 107 is connected to a wiring for supplying a high power supply potential $V_{dd}$.

The other of the source and the drain of each of the second transistor 102, the fourth transistor 104, the sixth transistor 106, and the eighth transistor 108 is connected to a wiring for supplying a low power supply potential $V_{ss}$.

The connection portion of the one of a source and a drain of the fifth transistor 105 and the one of a source and a drain of the sixth transistor 106 is connected to a gate of the second transistor 102, a gate of the third transistor 103, and a gate of the seventh transistor 107, via the switch T1. In other words, the first output terminal OUT of the level shifter L1 is connected to one of input terminals of each of the buffer B1 and the buffer B2 and a third input terminal INp of the level shifter L1, via the switch T1.

Further, the connection portion of the one of a source and a drain of the seventh transistor 107 and the one of a source and a drain of the eighth transistor 108 is connected to a gate of the first transistor 101, a gate of the fourth transistor 104, and a gate of the fifth transistor 105, via the switch T2. In other words, the second output terminal OUTB of the level shifter L1 is connected to the other of the input terminals of each of the buffer B1 and the buffer B2 and a fourth input terminal INpB of the level shifter L1, via the switch T2.

The connection portion of the one of a source and a drain of the first transistor 101 and the one of a source and a drain of the second transistor 102 is connected to a gate of the sixth transistor 106. Thus, the output terminal of the buffer B1 and the second input terminal INB of the level shifter L1 are connected.

The connection portion of the one of a source and a drain of the third transistor 103 and the one of a source and a drain of the fourth transistor 104 is connected to a gate of the eighth transistor 108. Thus, the output terminal of the buffer B2 and the first input terminal IN of the level shifter L1 are connected.

The first transistor 101 to the fourth transistor 104 are n-channel transistors with a small amount of off-state current. The transistor with a small amount of off-state current is a transistor in which a channel region is formed using a semiconductor film with a wide energy gap (e.g., 2 eV or more, preferably 2.5 eV or more, further preferably 3 eV or more). Typically, a transistor in which a channel region is formed using an oxide semiconductor film, silicon carbide, gallium nitride, or the like can be given as an example.

As an example of an n-channel transistor with a small amount of off-state current, a transistor in which a channel region is formed using an oxide semiconductor film is described here. Note that in FIG. 2 and FIG. 3, "OS" is written beside some transistors in order to indicate that the channel regions of the "OS" transistors are each formed using an oxide semiconductor film.

Further, the fifth transistor 105 and the seventh transistor 107 are p-channel transistors. The sixth transistor 106 and the eighth transistor 108 are n-channel transistors. The fifth transistor 105 to the eighth transistor 108 each include a semiconductor substrate described later or a semiconductor film provided over an insulating substrate.

Next, another mode of a latch circuit included in the semiconductor device is described with reference to FIG. 3. In a latch circuit 110 described in this embodiment, some of transistors in a level shifter circuit form inverters, which is different from the level shifter in the latch circuit 100 illustrated in FIG. 2.

Figure 3:
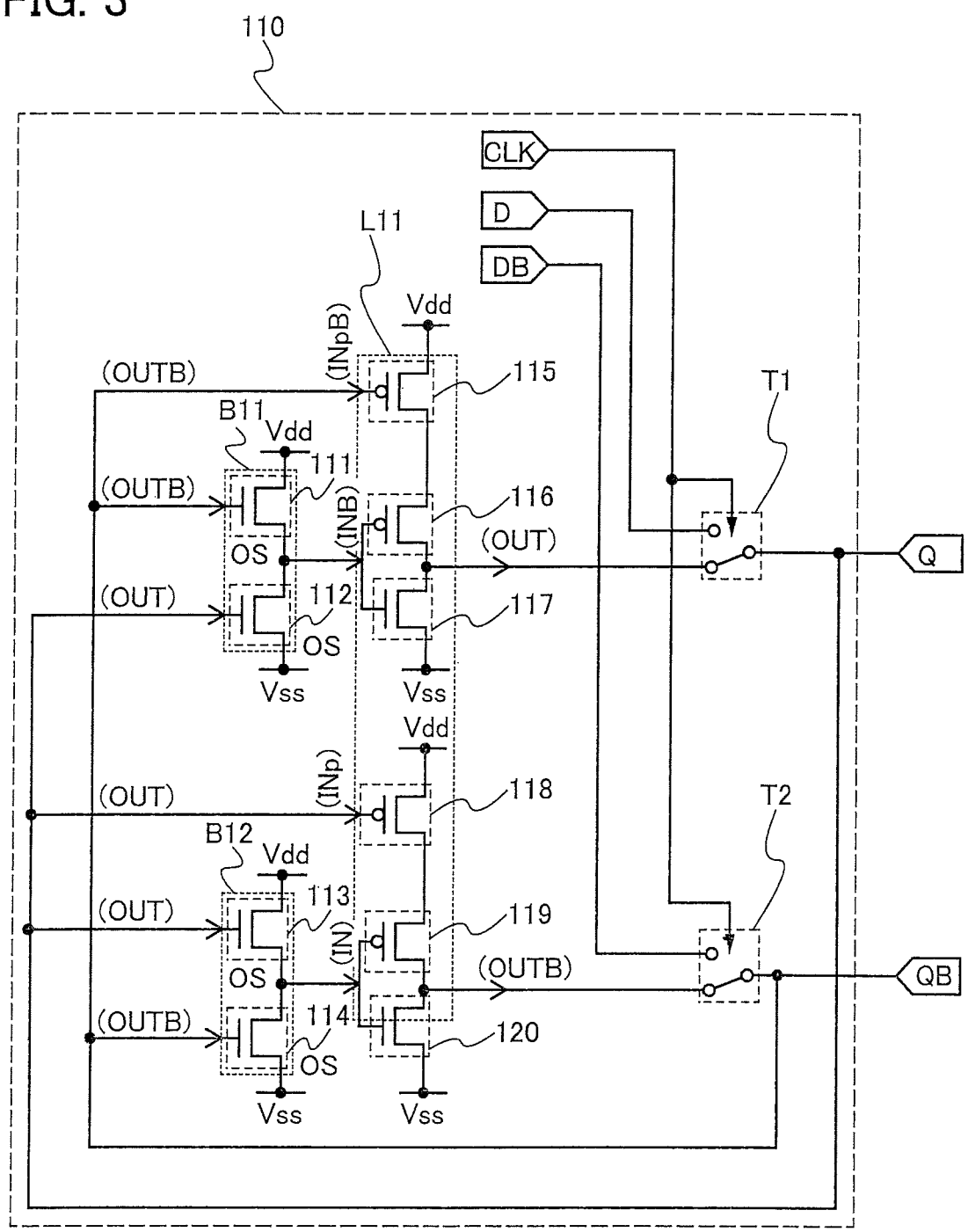
FIG. 3 is a circuit diagram showing a latch circuit according to one embodiment of the present invention.

FIG. 3 is a circuit diagram showing one mode of the latch circuit 110. The latch circuit 110 includes a buffer B11 in which a first transistor 111 and a second transistor 112 are connected in series, a buffer B12 in which a third transistor 113 and a fourth transistor 114 are connected in series, and a level shifter L11. The level shifter L11 includes a fifth transistor 115, a sixth transistor 116, and a seventh transistor 117 connected in series, and an eighth transistor 118, a ninth transistor 119, and a tenth transistor 120 connected in series.

In addition, a first terminal D, a second terminal DB, and a third terminal CLK to which a clock signal for controlling states of the switch T1 and the switch T2 is input are provided. Note that to the second terminal DB, an inverted signal of a signal input to the first terminal D is input. Further, an output terminal Q connected to the switch T1 and an output terminal QB connected to the switch T2 are provided. Note that from the output terminal QB, an inverted signal of a signal output from the output terminal Q is output.

In the buffer B11, one of a source and a drain of the first transistor 111 is connected to one of a source and a drain of the second transistor 112. This connection portion corresponds to an output terminal of the buffer B11.

In the buffer B12, one of a source and a drain of the third transistor 113 is connected to one of a source and a drain of the fourth transistor 114. This connection portion corresponds to an output terminal of the buffer B12.

In the level shifter L11, one of a source and a drain of the sixth transistor 116 is connected to one of a source and a drain of the seventh transistor 117. This connection portion is a first output terminal OUT of the level shifter L11. Further, one of a source and a drain of the fifth transistor 115 is connected to the other of the source and the drain of the sixth transistor 116.

In the level shifter L11, one of a source and a drain of the ninth transistor 119 is connected to one of a source and a drain of the tenth transistor 120. This connection portion is a second output terminal OUTB of the level shifter L11. Further, one of a source and a drain of the eighth transistor 118 is connected to the other of the source and the drain of the ninth transistor 119.

The other of the source and the drain of each of the first transistor 111, the third transistor 113, the fifth transistor 115, and the eighth transistor 118 is connected to a wiring for supplying a high power supply potential $V_{dd}$.

The other of the source and the drain of each of the second transistor 112, the fourth transistor 114, the seventh transistor 117, and the tenth transistor 120 is connected to a wiring for supplying a low power supply potential $V_{ss}$.

The connection portion of the one of a source and a drain of the sixth transistor 116 and the one of a source and a drain of the seventh transistor 117 is connected to a gate of the second transistor 112, a gate of the third transistor 113, and a gate of the eighth transistor 118, via the switch T1. In other words, the first output terminal OUT of the level shifter L11 is connected to one of input terminals of each of the buffer B11 and the buffer B12 and a third input terminal INp of the level shifter L11, via the switch T1.

The connection portion of the one of a source and a drain of the ninth transistor 119 and the one of a source and a drain of the tenth transistor 120 is connected to a gate of the first transistor 111, a gate of the fourth transistor 114, and a gate of the fifth transistor 115, via the switch T2. In other words, the second output terminal OUTB of the level shifter is connected to the other of the input terminals of each of the buffer B11 and the buffer B12 and the fourth input terminal INpB of the level shifter L11, via the switch T2.

Further, the connection portion of the one of a source and a drain of the first transistor 111 and the one of a source and a drain of the second transistor 112 is connected to gates of the sixth transistor 116 and the seventh transistor 117. Thus, the output terminal of the buffer B11 and the second input terminal INB of the level shifter L11 are connected to each other.

Further, the connection portion of the one of a source and a drain of the third transistor 113 and the one of a source and a drain of the fourth transistor 114 is connected to gates of the ninth transistor 119 and the tenth transistor 120. Thus, the output terminal of the buffer B12 and the first input terminal IN of the level shifter L11 are connected to each other.

The first transistor 111 to the fourth transistor 114 are n-channel transistors with a small amount of off-state current. The n-channel transistor with a small amount of off-state current is a transistor in which a channel region is formed using a semiconductor film with a wide energy gap (e.g., 2 eV or more, preferably 2.5 eV or more, further preferably 3 eV or more). Typically, a transistor in which a channel region is formed using an oxide semiconductor film, silicon carbide, gallium nitride, or the like can be given as an example.

The fifth transistor 115, the sixth transistor 116, the eighth transistor 118, and the ninth transistor 119 are p-channel transistors. The seventh transistor 117 and the tenth transistor 120 are n-channel transistors. With use of the sixth transistor 116 and the seventh transistor 117, the inverter is formed. With use of the ninth transistor 119 and the tenth transistor 120, the inverter is formed. The fifth transistor 115 to the tenth transistor 120 are each a transistor including a semiconductor substrate described later or a semiconductor film provided over an insulating substrate.

In the latch circuits 100 and 110 shown in FIG. 2 and FIG. 3, even if the potential of the node decreases due to the long stop of power supply, the potential is increased by the level shifter L1 or the level shifter L11 and output; thus, data of the node can be read out. Further, by a CLK signal, the first output terminal OUT of the level shifter L1 (L11) is connected to one of the input terminals of the buffer B1 (B11) and one of the input terminals of the buffer B2 (B12) via the switch T1, and the second output terminal OUTB of the level shifter L1 (L11) is connected to the other of the input terminals of the buffer B1 (B11) and the other of the input terminals of the buffer B2 (B12) via the switch T2, so that the read data is fed back to the nodes. Accordingly, the potentials of the nodes can be refreshed.

Further, in the level shifter L11 of the latch circuit 110 shown in FIG. 3, the inverter is provided between the wiring for supplying a high power supply potential $V_{dd}$ and the wiring for supplying a low power supply potential $V_{ss}$; the through current from the wiring for supplying a high power supply potential $V_{dd}$ to the wiring for supplying a low power supply potential $V_{ss}$ can be reduced, and thus power consumption can be further reduced as compared with the case of the latch circuit in FIG. 2.

In the latch circuit described in this embodiment, data is held in a node where one of a source and a drain of the transistor whose channel region is formed in an oxide semiconductor film is connected to a gate of the n-channel transistor or the p-channel transistor. The transistor whose channel region is formed in an oxide semiconductor film has an extremely small amount of off-state current; thus, even after supplying the power supply voltage is stopped, the voltage of the node can be held for a long time. That is, the latch circuit functions as a nonvolatile latch circuit.

The refresh operation after power is supplied is easily performed. Thus, malfunction in holding data can be reduced and a backup operation is not needed. As a result, the starting time can be shortened.

A magnetic tunnel junction element (an MTJ element) is known as a nonvolatile memory element. The MTJ element stores data in a low resistance state when the magnetization directions of ferromagnetic films provided above and below with an insulating film provided therebetween are parallel, and stores data in a high resistance state when the spin directions are anti-parallel. Therefore, the principles of the MTJ element and the latch circuit including an oxide semiconductor in this embodiment are completely different from each other. Table 1 shows comparison between the MTJ element and the semiconductor device according to this embodiment.

TABLE 1

|  | Spintronics (MTJ element) | Oxide Semiconductor |
|---|---|---|
| 1) Heat Resistance | Curie Temperature | Process Temperature at 500° C. (Reliability at 150° C.) |
| 2) Driving Method | Current Driving | Voltage Driving |
| 3) Principle of Writing Operation | Magnetization Direction of Magnetic films | On/Off of FET |
| 4) Si LSI | Suitable for Bipolar LSI | Suitable for MOS LSI |
| 5) Overhead | Large (Due to Large Joule Heat) | Smaller by 2 to 3 or more Orders of Magnitude than the MTJ Element (Because of charging and discharging of parasitic capacitance) |
| 6) Nonvolatility | Utilizing Spin | Utilizing Small Off-State Current |

TABLE 1-continued

| | Spintronics (MTJ element) | Oxide Semiconductor |
|---|---|---|
| 7) Number of Times of Reading Operation | Unlimited | Unlimited |
| 8) 3D Display | Difficult (At Most Two Layers) | Easy (Number of Layers is Unlimited) |
| 9) Integration Degree ($F^2$) | 4 $F^2$ to 15 $F^2$ | Depending on Number of Layers for 3D Display |
| 10) Material | Magnetic Rare Earth Element | Oxide Semiconductor Material |
| 11) Cost per Bit | High | Low |
| 12) Magnetic Field Resistance | Low | High |

The MTJ element is disadvantageous in that magnetic properties are lost when the temperature is the Curie temperature or higher because a magnetic material is used. In addition, the MTJ element is compatible with a silicon bipolar device because current driving is employed; however, the bipolar device is unsuitable for high integration. Furthermore, the MTJ element has a problem in that power consumption is increased by an increase in memory capacity, though the MTJ element consumes an extremely small amount of current during data writing.

In principle, the MTJ element has low resistance to a magnetic field, so that the magnetization direction is likely to change when the MTJ element is exposed to a high magnetic field. Further, it is necessary to control magnetic fluctuation due to nanoscaling of a magnetic body used for the MTJ element.

Further, a rare-earth element is used for the MTJ element; therefore, incorporation of a process of the MTJ element into a process of a silicon semiconductor which avoids metal contamination should be paid high attention to. Further, the material cost per bit of the MTJ element is expensive.

On the other hand, the transistor including an oxide semiconductor, which is described in this embodiment, has an element structure and an operation principle which are similar to those of a silicon MOSFET except that a semiconductor material for forming a channel is a metal oxide. Further, the transistor including an oxide semiconductor is not affected by a magnetic field, and does not cause soft errors. This shows that the transistor is highly compatible with a silicon integrated circuit.

This embodiment can be implemented in appropriate combination with any of the other embodiments.

(Embodiment 2)

Figure 4:
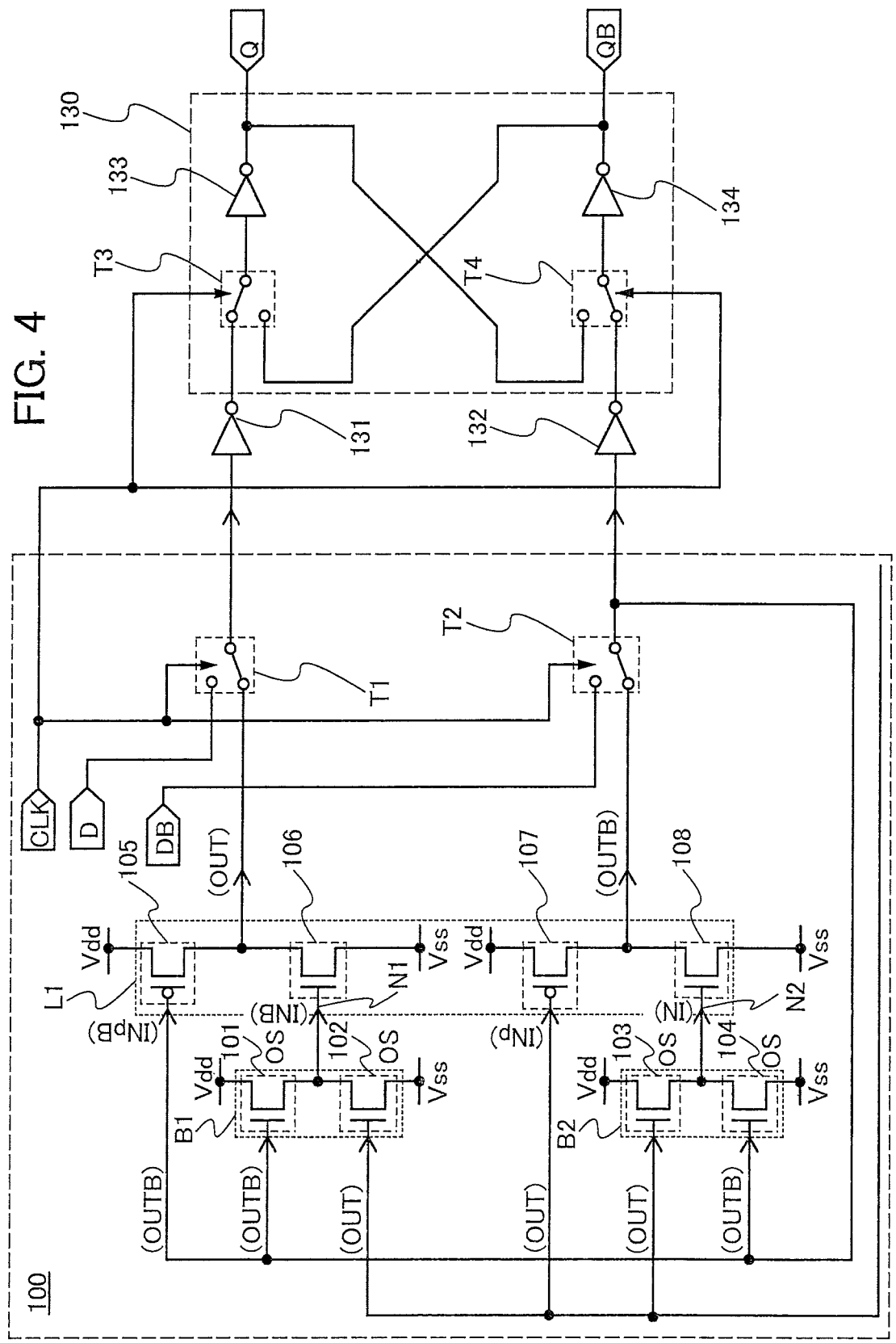
FIG. 4 is a circuit diagram showing a D-flip-flop circuit according to one embodiment of the present invention.

In this embodiment, a flip-flop circuit including the latch circuit described in Embodiment 1 will be described with reference to FIG. 4. Here, as a flip-flop circuit, a D(Delayed) flip-flop circuit is used for description.

In the D flip-flop circuit, the latch circuit 100 (hereinafter, the latch circuit 100 is referred to as the latch circuit 100 in the previous stage) is connected to a latch circuit 130 in a subsequent stage of the latch circuit 100. Specifically, a first output terminal of the latch circuit 100 in the previous stage is connected to a first input terminal of the latch circuit 130 in the subsequent stage. A second output terminal of the latch circuit 100 in the previous stage is connected to a second input terminal of the latch circuit 130 in the subsequent stage. Note that an inverter 131 may be provided between the first output terminal of the latch circuit 100 in the previous stage and the first input terminal of the latch circuit 130 in the subsequent stage, and an inverter 132 may be provided between the second output terminal of the latch circuit 100 in the previous stage and the second input terminal of the latch circuit 130 in the subsequent stage.

Although the latch circuit 100 described in Embodiment 1 is used as the latch circuit in the previous stage here, the latch circuit 110 may be used instead of the latch circuit 100.

As the latch circuit 130 in the subsequent stage, a conventional latch circuit can be used as appropriate. Alternatively, as the latch circuit 130 in the subsequent stage, the latch circuit 100 or the latch circuit 110 described in Embodiment 1 can be used. Note that since the latch circuit in the previous stage is a nonvolatile latch circuit, a volatile latch circuit or a nonvolatile latch circuit can be used as the latch circuit 130 as appropriate.

Here, as an example, the latch circuit 130 includes a switch T3, an inverter 133 which is connected to an output terminal of the switch T3, a switch T4 which is connected to an output terminal of the inverter 133, and an inverter 134 which is connected to an output terminal of the switch T4. Further, an input terminal of the switch T3 is connected to an output terminal of the inverter 131 or an output terminal of the inverter 134. An input terminal of the switch T4 is connected to an output terminal of the inverter 132 or the output terminal of the inverter 133. The output terminal of the inverter 133 is connected to an output terminal Q. The output terminal of the inverter 134 is connected to an output terminal QB. From the output terminal QB, an inverted signal of a signal output from the output terminal Q is output.

Connection of the switch T3 to the output terminal of the inverter 131 or the output terminal of the inverter 134 is controlled by a CLK signal input from the third terminal CLK. Connection of the switch T4 to the output terminal of the inverter 132 or the output terminal of the inverter 133 is controlled by a signal input from the third terminal CLK.

In the D flip-flop circuit, an input signal that is not synchronized with a CLK signal is held in the latch circuit 100 in the previous stage, and an input signal that is synchronized with a CLK signal is output to the latch circuit 130 in the subsequent stage. In the latch circuit 130 in the subsequent stage, data output from the latch circuit 100 in the previous stage is held, synchronized with a CLK signal, and output to the output terminals Q and QB. A CLK signal from the third terminal is input to the switches T1 and T2 included in the latch circuit 100 in the previous stage and the switches T3 and T4 included in the latch circuit 130 in the subsequent stage, so that the states of the switches are controlled.

By a first CLK signal (one of High and Low), in the latch circuit 100 in the previous stage, the first terminal D and the first output terminal are connected via the switch T1, and the second terminal DB and the second output terminal are connected via the switch T2. As a result, signals from the first terminal D and the second terminal DB are input to the latch circuit 100 in the previous stage, whereby data is written to the nodes N1 and N2 in the latch circuit 100 in the previous stage. At this time, in the latch circuit 130 in the subsequent stage, the output terminal of the inverter 134 and the input terminal of the inverter 133 are connected via the switch T3, and the output terminal of the inverter 133 and the input terminal of the inverter 134 are connected via the switch T4. As a result, data which has been written in the latch circuit 130 in the subsequent stage is output to the output terminals Q and QB.

On the other hand, by a second CLK signal (the other of High and Low), in the latch circuit 100 in the previous stage, the first output terminal OUT of the level shifter L1 and the first output terminal are connected via the switch T1, and the second output terminal OUTB of the level shifter L1 and the second output terminal are connected via the switch T2. As a result, data written to the nodes N1 and N2 is output from the first output terminal and the second output terminal of the latch circuit 100 in the previous stage to the latch circuit 130 in the subsequent stage. At this time, in the latch circuit 130 in the subsequent stage, the output terminal of the inverter 131 and the input terminal of the inverter 133 are connected via the switch T3, and the output terminal of the inverter 132 and the input terminal of the inverter 134 are connected via the switch T4. As a result, data output from the latch circuit 100 in the previous stage is written to the latch circuit 130 in the subsequent stage.

Therefore, with use of the latch circuit described in Embodiment 1 at least for the latch circuit in the previous stage, a nonvolatile flip-flop circuit can be manufactured.

This embodiment can be implemented in appropriate combination with any of the other embodiments.

(Embodiment 3)

In this embodiment, a method for manufacturing the semiconductor device described in Embodiment 1 will be described with reference to FIG. 2, FIGS. 5A to 5D, FIGS. 6A to 6C, FIGS. 7A to 7C, and FIGS. 8A and 8B. Here, a method for manufacturing the first transistor 101 which includes a channel region formed in an oxide semiconductor film, the fifth transistor 105 that is a p-channel transistor, and the sixth transistor 106 that is an n-channel transistor, which are illustrated in a circuit diagram of FIG. 2, is described. In FIGS. 5A to 5D, FIGS. 6A to 6C, FIGS. 7A to 7C, and FIGS. 8A and 8B, cross-sectional views along A-B correspond to a cross section of a region where the first transistor 101, the fifth transistor 105, and the sixth transistor 106 are formed, and cross-sectional views along C-D correspond to a cross section of a region where one of a source and a drain of the first transistor 101 is connected to the gate of the sixth transistor 106.

Figure 5A:
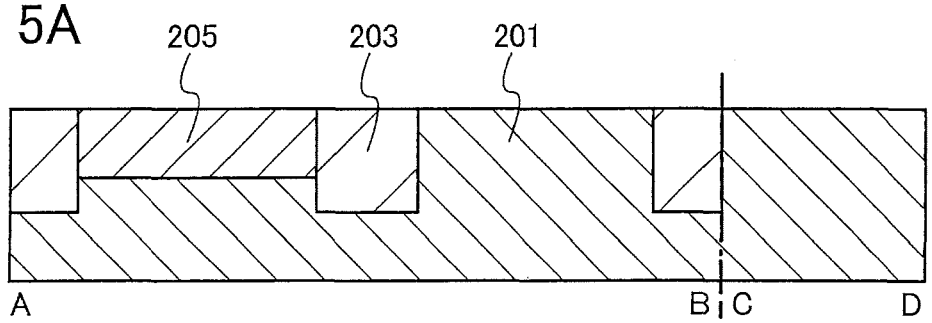
FIGS. 5A to 5D are cross-sectional views illustrating a method for manufacturing a semiconductor device according to one embodiment of the present invention.

As illustrated in FIG. 5A, an element isolation region 203 is formed in an n-type semiconductor substrate 201, and then a p-well region 205 is formed in part of the n-type semiconductor substrate 201.

Examples of substrates used as the n-type semiconductor substrate 201 include a single crystal silicon substrate (a silicon wafer) having n-type conductivity, and a compound semiconductor substrate (e.g., a SiC substrate, a sapphire substrate, a GaN substrate, or the like).

An SOI (silicon on insulator) substrate may be used instead of the n-type semiconductor substrate 201, and as the SOI substrate, the following substrate can be given: a so-called SIMOX (separation by implanted oxygen) substrate which is formed in such a manner that after an oxygen ion is implanted into a mirror-polished wafer, an oxide layer is formed at a certain depth from the surface by high-temperature heating and eliminating defects generated in a surface layer, or an SOI substrate formed by using a technique called a Smart-Cut method in which a semiconductor substrate is cleaved by utilizing growth of a minute void, which is formed by implantation of a hydrogen ion, by thermal treatment; an ELTRAN (epitaxial layer transfer: a registered trademark of Canon Inc.) method; or the like. Further alternatively, instead of the n-type semiconductor substrate 201, a substrate where a semiconductor layer having crystallinity is formed over an insulating substrate may be used.

The element isolation region 203 is formed by a known local oxidation of silicon (LOCOS) method or shallow trench isolation (STI) method, or the like.

To the p-well region 205, an impurity element imparting p-type conductivity, such as boron, is added at a concentration about $5\times10^{15}$ cm$^{-3}$ to $1\times10^{16}$ cm$^{-3}$. With use of a mask formed over part of the semiconductor substrate 201, an impurity element imparting p-type conductivity is added to another part of the semiconductor substrate 201, so that the p-well region 205 is formed.

Note that although the n-type semiconductor substrate is used here, a p-type semiconductor substrate may be used, and an impurity element imparting n-type conductivity, such as phosphorus or arsenic, may be added to the p-type semiconductor substrate to form an n-well region.

Figure 5B:
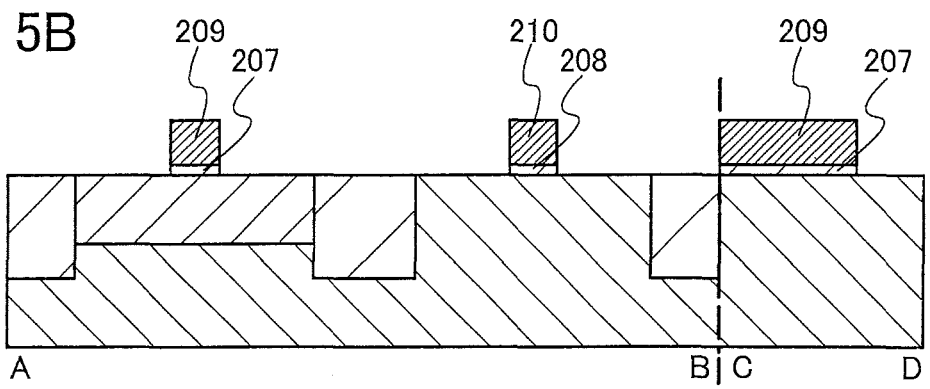

Next, as illustrated in FIG. 5B, gate insulating films 207 and 208 and gate electrodes 209 and 210 are formed over the semiconductor substrate 201.

A surface of the semiconductor substrate 201 is oxidized by performing heat treatment, so that a silicon oxide film is formed. Alternatively, a silicon oxide film is formed by a thermal oxidation method, and a surface of the silicon oxide film is nitrided by nitriding treatment, so that a stacked structure of the silicon oxide film and a film including oxygen and nitrogen (oxynitride silicon film) is formed. Next, part of the silicon oxide film or stacked structure of the silicon oxide film and the silicon oxynitride film is selectively etched, so that the gate insulating films 207 and 208 are formed. Alternatively, a silicon oxide, a silicon oxynitiride, or a high dielectric constant substance (also referred to as a high-k material) including a metal oxide such as a tantalum oxide, a hafnium oxide, a hafnium silicate oxide, a zirconium oxide, an aluminum oxide, or a titanium oxide or a rare-earth oxide such as a lanthanum oxide, or the like is deposited to have a thickness of 5 to 50 nm by a CVD method, a sputtering method, or the like, and then the oxide is partly etched selectively, so that the gate insulating films 207 and 208 are formed.

The gate electrodes 209 and 210 are preferably formed using a material selected from metals such as tantalum, tungsten, titanium, molybdenum, chromium, and niobium, or an alloy material or a compound material including any of the metals as its main component. Further, polycrystalline silicon to which an impurity element such as phosphorus is added can be used. Alternatively, the gate electrodes 209 and 210 are formed with a stacked structure of a metal nitride film and the above metal film. As the metal nitride, tungsten nitride, molybdenum nitride, or titanium nitride can be used. When the metal nitride film is provided, adhesiveness of the metal film formed on the metal nitride film can be increased; accordingly, separation can be prevented.

The gate electrodes 209 and 210 are formed by depositing a conductive film by a sputtering method, a CVD method, or the like and etching part of the conductive film selectively.

Here, heat treatment is performed and a surface of the semiconductor substrate 201 is oxidized, so that a silicon oxide film is formed, and a conductive film in which a tantalum nitride film and a tungsten film are stacked is formed by a sputtering method over the silicon oxide film. Then, part of the silicon oxide film and part of the conductive film are selectively etched, so that the gate insulating films 207 and 208 and the gate electrodes 209 and 210 are formed.

Figure 5C:
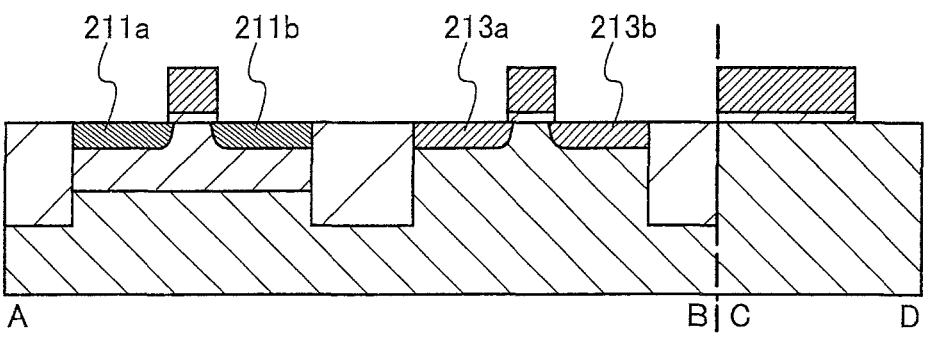

Next, as illustrated in FIG. 5C, an impurity element imparting p-type conductivity is added to the semiconductor substrate 201, so that p-type impurity regions 213a and 213b are formed. Further, an impurity element imparting n-type conductivity is added to the p-well region 205, so that n-type impurity regions 211a and 211b are formed. Each of the concentration of the impurity element imparting p-type conductivity in the p-type impurity regions 213a and 213b and the concentration of the impurity element imparting n-type conductivity in the n-type impurity regions 211a and 211b is higher than or equal to $1\times10^{19}$/cm$^3$ and lower than or equal to $1\times10^{21}$/cm$^3$. The impurity element imparting p-type conductivity and the impurity element imparting n-type conductivity are added to the p-well region 205 and the semiconductor substrate 201, respectively, by an ion doping method, an ion implantation method, or the like.

Figure 5D:
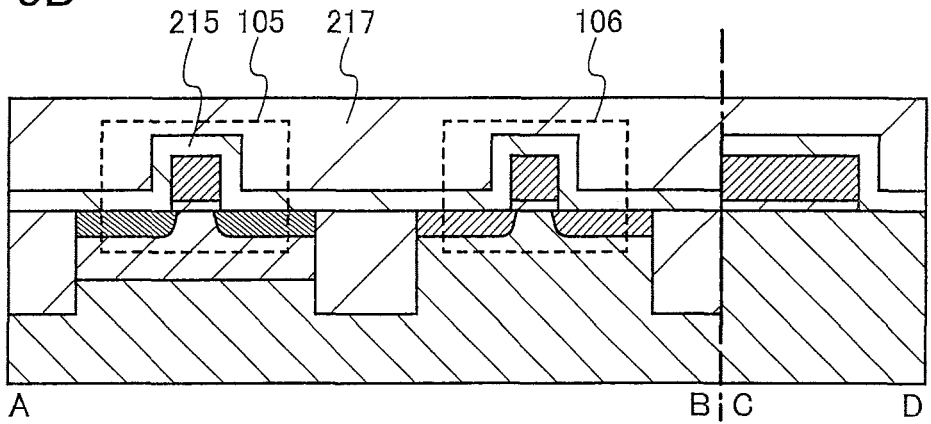

Next, as illustrated in FIG. 5D, insulating films 215 and 217 are formed over the semiconductor substrate 201, the element isolation region 203, the gate insulating films 207 and 208, and the gate electrodes 209 and 210 by a sputtering method, a CVD method, or the like.

The insulating films 215 and 217 each may be formed with a single layer or a stacked layer using one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, the amount of hydrogen in the insulating film 215 is increased. Thus, the semiconductor substrate is hydrogenated by heat treatment, and dangling bonds are terminated by hydrogen, so that defects can be reduced.

Note that planarity of the insulating film 217 can be high when the insulating film 217 is formed using an inorganic material such as boron phosphorus silicon glass (BPSG), or an organic material such as polyimide or acrylic.

After the insulating film 215 or the insulating film 217 is formed, heat treatment is performed to activate the impurity elements added to the impurity regions 211a, 211b, 213a, and 213b.

Through the above steps, the seventh transistor 107 that is a p-channel transistor and the eighth transistor 108 that is an n-channel transistor, illustrated in FIG. 2, can be manufactured.

Next, part of the insulating films 215 and 217 are selectively etched, so that opening portions are formed. Next, contact plugs 219a to 219d are formed in the opening portions. Typically, the contact plugs 219a to 219d are formed as follows: a conductive film is formed by a sputtering method, a CVD method, a plating method, or the like; and planarization treatment is performed on the conductive film by a chemical mechanical polishing (CMP) method to remove unnecessary portions of a surface of the conductive film.

For formation of the conductive film that is to be the contact plugs 219a to 219d, tungsten silicide is formed by a CVD method using a $WF_6$ gas and a $SiH_4$ gas, and the opening portions are filled with the conductive film Next, an insulating film is formed by a sputtering method, a CVD method, a plating method, or the like over the insulating film 217 and the contact plugs 219a to 219d, and then part of the insulating film is selectively etched, so that insulating films 221a to 221e each having a groove portion are formed. Next, a conductive film is formed by a sputtering method, a CVD method, or the like, and then planarization treatment is performed by a CMP method or the like to remove unnecessary portions of a surface of the conductive film, so that wirings 223a to 223c are formed (see FIG. 6A).

The insulating films 221a to 221e can be formed using a material similar to that of the insulating film 215.

The wirings 223a to 223c are formed to have a single-layer structure or a stacked-layer structure using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

With use of the planarized insulating films 221a to 221e and wirings 223a to 223c, variation in electric characteristics of transistors including an oxide semiconductor film formed later can be reduced. In addition, the transistors including an oxide semiconductor film can be formed with high yield.

Next, it is preferable that hydrogen, moisture, and the like included in the insulating films 221a to 221e and wirings 223a to 223c be eliminated by heat treatment or plasma treatment. As a result, hydrogen, moisture, and the like can be prevented from being diffused into an insulating film and an oxide semiconductor film, which are formed later, by heat treatment performed later. The heat treatment is performed at a temperature higher than or equal to 100° C. and lower than the strain point of the substrate in an inert atmosphere, a reduced-pressure atmosphere, or a dry air atmosphere. Further, for the plasma treatment, a rare gas, oxygen, nitrogen, or nitrogen oxide (e.g., nitrous oxide, nitrogen monoxide, or nitrogen dioxide) is used.

Next, an insulating film 225 is formed over the insulating films 221a to 221e and the wirings 223a to 223c by a sputtering method, a CVD method, or the like. The insulating film 225 is formed to have a single layer or a stacked layer using any of silicon oxide, silicon oxynitride, silicon nitride oxide, gallium oxide, hafnium oxide, yttrium oxide, aluminum oxide, or aluminum oxynitride. Further, the insulating film 225 is preferably formed using an oxide insulating film from which part of oxygen is released by heating. The oxide insulating film from which part of oxygen is released by heating is preferably an oxide insulating film which contains oxygen at a proportion exceeding the stoichiometric proportion. The oxide insulating film from which part of oxygen is released by heating can diffuse oxygen into the oxide semiconductor film by heating, because oxygen is released from the oxide insulating film by heating.

Figure 6A:
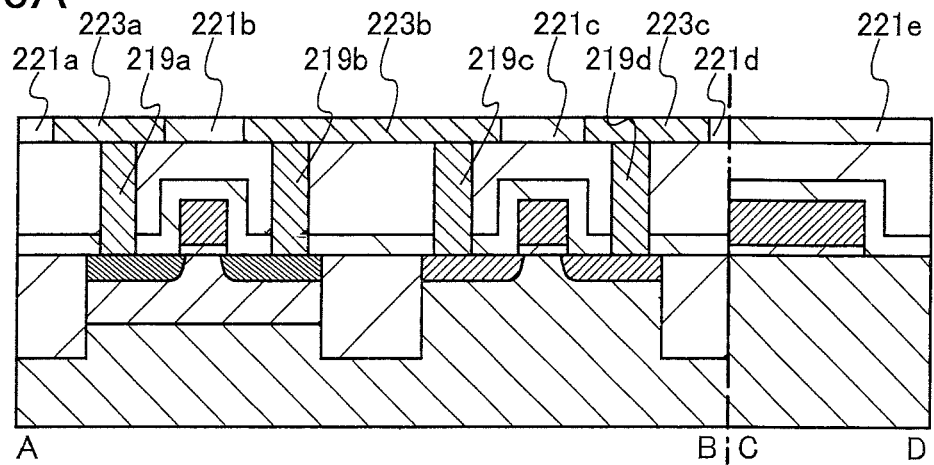
FIGS. 6A to 6C are cross-sectional views illustrating the method for manufacturing a semiconductor device according to one embodiment of the present invention.
Figure 6B:
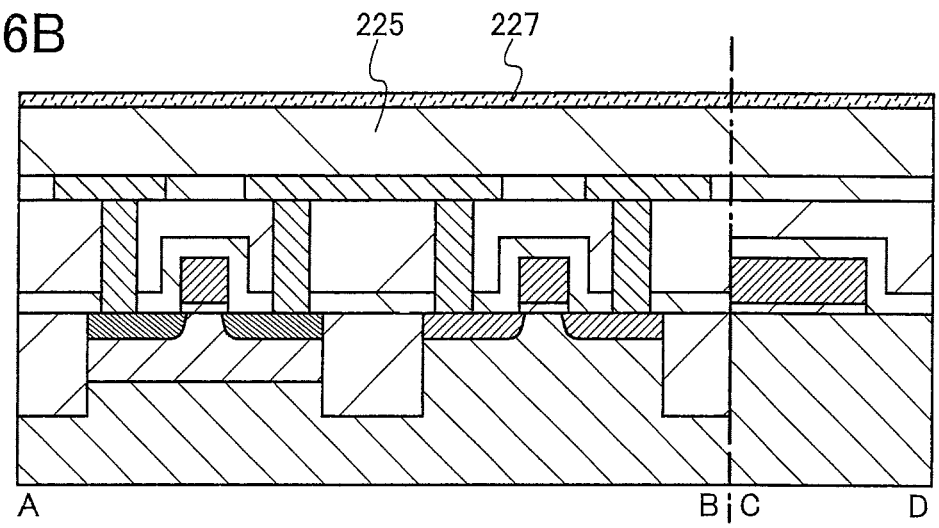
Figure 6C:
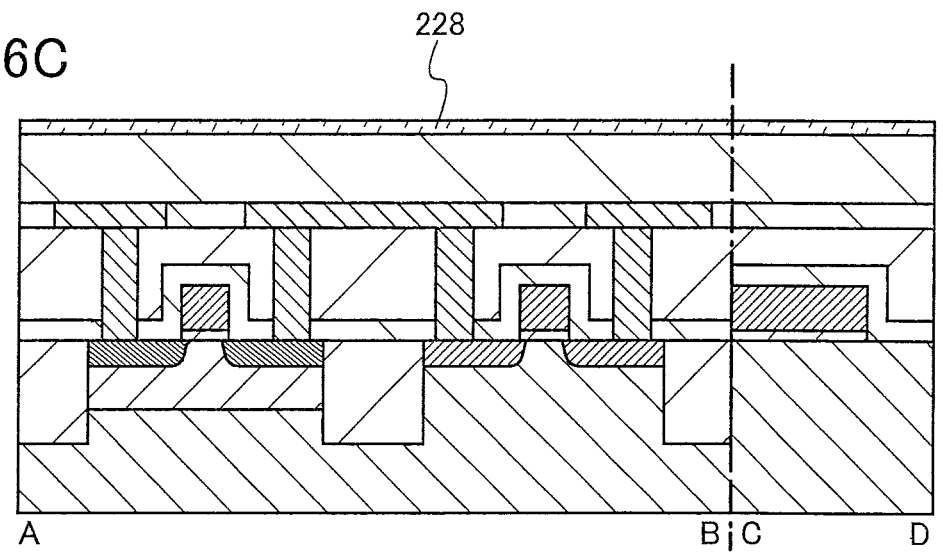

Next, an oxide semiconductor film 227 is formed over the insulating film 225 by a sputtering method, a coating method, a printing method, a pulsed laser deposition method, or the like (see FIG. 6B). Here, as the oxide semiconductor film 227, an oxide semiconductor film is formed by a sputtering method to have a thickness greater than or equal to 1 nm and less than or equal to 50 nm, preferably greater than or equal to 3 nm and less than or equal to 30 nm. When the oxide semiconductor film 227 has a thickness in the above range, a short-channel effect of the transistor can be suppressed.

The oxide semiconductor film 227 preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, a single-component metal oxide such as an indium oxide, a tin oxide, or a zinc oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide; a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide can be used.

For the above-listed metal oxides, an In—Ga—Zn-based metal oxide, for example, is an oxide whose main components are In, Ga, and Zn, and there is no particular limitation on the ratio of In:Ga:Zn. Further, the In—Ga—Zn-based oxide may contain a metal element other than In, Ga, and Zn.

Alternatively, a material represented by 1 $nMO_3(ZnO)_m$ (m>0 is satisfied, and in is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based metal oxide with an atomic ratio where In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based metal oxide with an atomic ratio where In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, the composition is not limited to those described above, and a material having the appropriate composition may be used depending on necessary semiconductor characteristics (e.g., field-effect mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high electric-filed mobility can be obtained relatively easily in the case where the In—Sn—Zn-based metal oxide is used. However, the field-effect mobility can be increased by reducing the defect density in the bulk also in the case where the In—Ga—Zn-based metal oxide is used.

Note that the case where the composition of an oxide having an atomic ratio, In:Ga:Zn=a:b:c (a+b+c=1), is in the neighborhood of the composition of an oxide having an atomic ratio, In:Ga:Zn=A:B:C (A+B+C=1), means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a planar surface can be obtained with relative ease, so that when a transistor is manufactured with use of the oxide semiconductor, interface scattering can be reduced, and relatively high field-effect mobility can be obtained with relative ease.

In an oxide semiconductor having crystallinity, defects in the bulk can be further reduced and when the surface flatness of the oxide semiconductor is improved, field-effect mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 tun, further preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

Note that the energy gap of a metal oxide which can form the oxide semiconductor film 227 is 2 eV or more, preferably 2.5 eV or more, further preferably 3 eV or more. In this manner, the off-state current of a transistor can be reduced by using an oxide semiconductor having a wide energy gap.

The concentration of alkali metals or alkaline earth metals in the oxide semiconductor film 227 is preferably lower than or equal to $1 \times 10^{18}$ atoms/cm$^3$, further preferably lower than or equal to $2 \times 10^{16}$ atoms/cm$^3$. When an alkali metal or an alkaline earth metal is bonded to an oxide semiconductor, carriers are generated in some cases, which causes an increase in the off-state current of the transistor.

The oxide semiconductor film 227 may contain nitrogen at a concentration lower than or equal to $5 \times 10^{18}$ atoms/cm$^3$.

The oxide semiconductor film 227 may have an amorphous structure.

As the oxide semiconductor film 227, a c-axis aligned crystalline oxide semiconductor (CAAC-OS) film including crystallized parts may be used.

CAAC-OS is an oxide semiconductor including a crystal with c-axis alignment which has a triangular or hexagonal atomic arrangement when seen from the direction of an a-b plane, a surface, or an interface and in which metal atoms are arranged in a layered manner, or metal atoms and oxygen atoms are arranged in a layered manner along a c-axis, and the direction of the a-axis or the b-axis is varied in the a-b plane (or the surface or the interface), that is, which rotates around the c-axis.

In a broad sense, CAAC-OS means a non-single-crystal material including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis direction.

The CAAC-OS is not a single crystal oxide, but this does not mean that the CAAC-OS is composed of only an amorphous component. Although the CAAC-OS includes a crystallized portion (crystalline portion), a boundary between one crystalline portion and another crystalline portion is not clear in some cases.

Nitrogen may be substituted for part of oxygen included in the CAAC-OS. The c-axes of individual crystalline portions included in CAAC-OS may be aligned in one direction (e.g., the direction perpendicular to a surface of a substrate over which CAAC-OS is formed, a surface of CAAC-OS, a surface of a CAAC-OS film, an interface of CAAC-OS, or the like). Alternatively, the normals of the a-b planes of the individual crystalline portions included in the CAAC-OS may be aligned in one direction (e.g., a direction perpendicular to the substrate surface or the surface, film surface, interface, or the like of the CAAC-OS).

The CAAC-OS becomes a conductor, a semiconductor, or an insulator depending on its composition or the like. The CAAC-OS transmits or does not transmit visible light depending on its composition or the like.

An example of a crystal structure of the CAAC-OS will be described in detail with reference to FIGS. 9A to 9E, FIGS. 10A to 10C, and FIGS. 11A to 11C. In FIGS. 9A to 9E, FIGS. 10A to 10C, and FIGS. 11A to 11C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 9A to 9E, O surrounded by a circle represents tetracoordianate O and a double circle represents tricoordenate O.

Figure 9A:
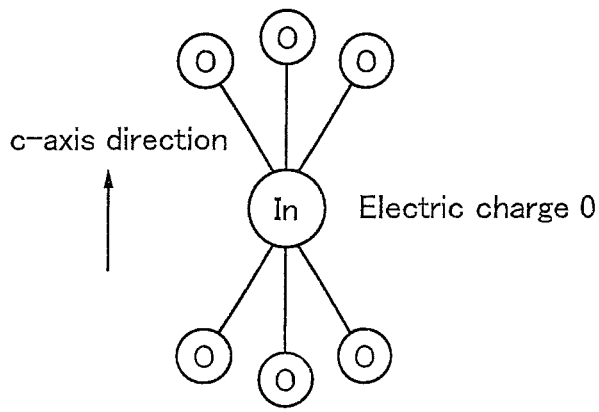
FIGS. 9A to 9E are diagrams each illustrating a crystal structure of an oxide material according to one embodiment of the present invention.

FIG. 9A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 9A is an octahedral structure, but is illustrated as a planar structure for simplicity. Note that three tetracoordinate O atoms exist in each of an upper half and a lower half in FIG. 9A. In the small group illustrated in FIG. 9A, electric charge is 0.

Figure 9D:
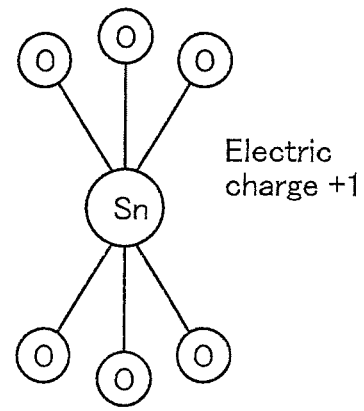
Figure 9B:
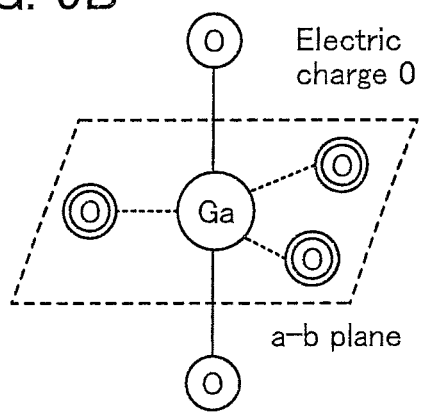

FIG. 9B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 9B. An In atom can also have the structure illustrated in FIG. 9B because an In atom can have five ligands. In the small group illustrated in FIG. 9B, electric charge is 0.

Figure 9E:
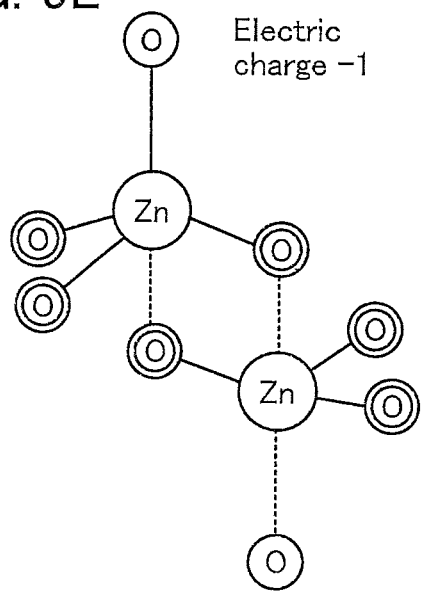
Figure 9C:
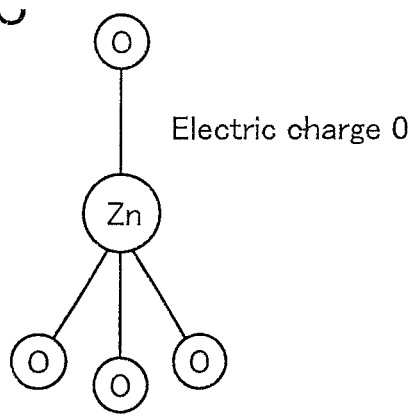

FIG. 9C illustrates a structure including one tetracoordinate Zn atom and four tetracoordinate O atoms proximate to the Zn atom. In FIG. 9C, one tetracoordinate O atom exists in an upper half and three tetracoordinate O atoms exist in a lower half Alternatively, three tetracoordinate O atoms may exist in the upper half and one tetracoordinate O atom may exist in the lower half in FIG. 9C. In the small group illustrated in FIG. 9C, electric charge is 0.

FIG. 9D illustrates a structure including one hexacoordinate Sn atom and six tetracoordinate O atoms proximate to the Sn atom. In FIG. 9D, three tetracoordinate O atoms exist in each of an upper half and a lower half. In the small group illustrated in FIG. 9D, electric charge is +1.

FIG. 9E illustrates a small group including two Zn atoms. In FIG. 9E, one tetracoordinate O atom exists in each of an upper half and a lower half. In the small group illustrated in FIG. 9E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 9A each have three proximate In atoms in the downward direction, and the three O atoms in the lower half each have three proximate In atoms in the upward direction. The one O atom in the upper half with respect to the pentacoordinate Ga atom in FIG. 9B has one proximate Ga atom in the downward direction, and the one O atom in the lower half has one proximate Ga atom in the upward direction. The one O atom in the upper half with respect to the tetracoordinate Zn atom in FIG. 9C has one proximate Zn atom in the downward direction, and the three O atoms in the lower half each have three proximate Zn atoms in the upward direction. In this manner, the number of the tetracoordinated O atoms above the metal atom is equal to the number of the proximity metal atoms below the tetracoordinated O atoms. Similarly, the number of the tetracoordinate O atoms below the metal atom is equal to the number of the proximity metal atoms above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 10A:
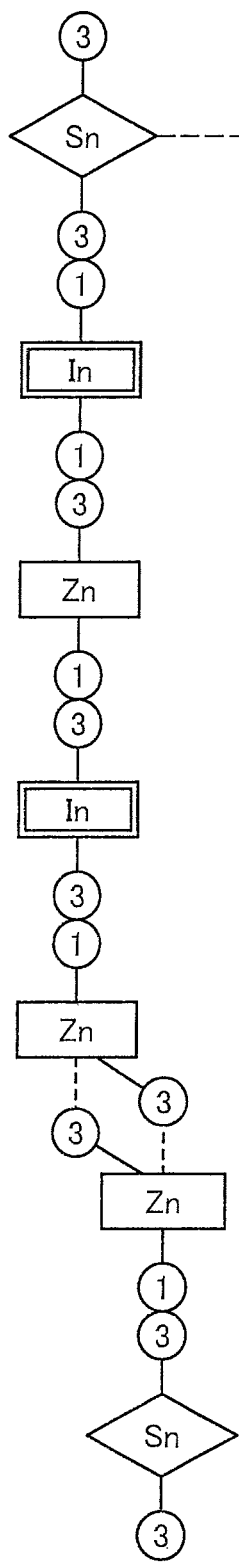
FIGS. 10A to 10C are diagrams illustrating a crystal structure of an oxide material according to one embodiment of the present invention.
Figure 10B:
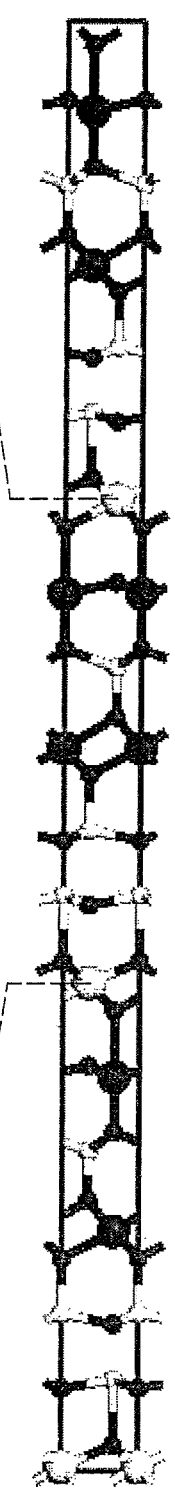
Figure 10C:
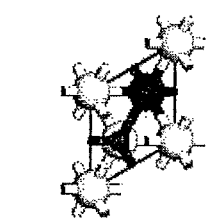

FIG. 10A illustrates a model of a medium group included in a layered structure of an In—Sn—Zn—O-based material. FIG. 10B illustrates a large group including three medium groups. Note that FIG. 10C illustrates an atomic arrangement in the case where the layered structure in FIG. 10B is observed from the c-axis direction.

In FIG. 10A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 10A, one tetracoordinate O atom existing in each of an upper half and a lower half with respect to an In atom is denoted by circled 1. FIG. 10A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 10A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 9E can be given. For example, with one small group including two Zn atoms, electric charge of one small group including a Sn atom can be cancelled, so that the total electric charge of the layered structure can be 0.

When the large group illustrated in FIG. 10B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (in is 0 or a natural number).

The above-described rule also applies to the following oxides: a four-component metal oxide such as an In—Sn—Ga—Zn-based metal oxide; a three-component metal oxide such as an In—Ga—Zn-based metal oxide (also referred to as IGZO), an In—Al—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide; and the like.

Figure 11A:
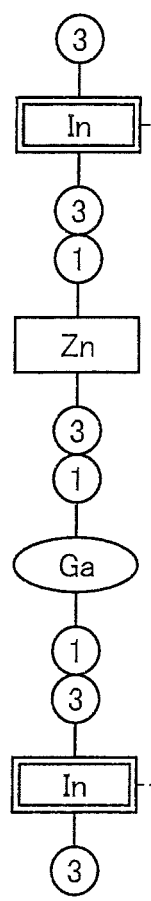
FIGS. 11A to 11C are diagrams illustrating a crystal structure of an oxide material according to one embodiment of the present invention.

As an example, FIG. 11A illustrates a model of a medium group included in a layered structure of an In—Ga—Zn—O-based material.

In the medium group included in the layered structure of the In—Ga—Zn—O-based material in FIG. 11A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 11B:
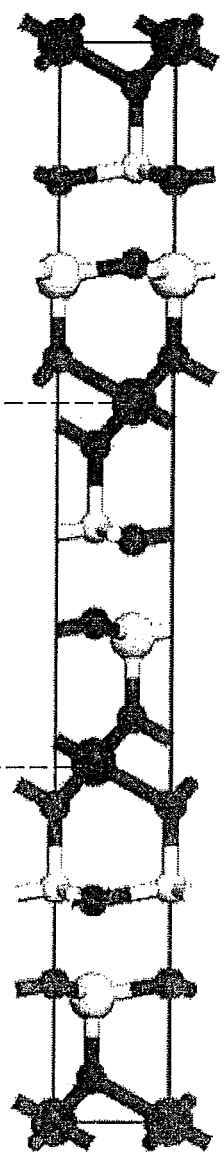
Figure 11C:
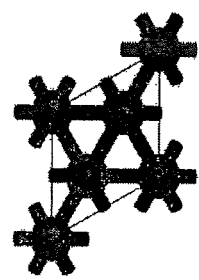

FIG. 11B illustrates a large group including three medium groups. Note that FIG. 11C illustrates an atomic arrangement in the case where the layered structure in FIG. 11B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 11A but also a medium group in which the arrangement of the In atom, the Ga atom, and the Zn atom is different from that in FIG. 11A.

When the large group illustrated in FIG. 11B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 12A:
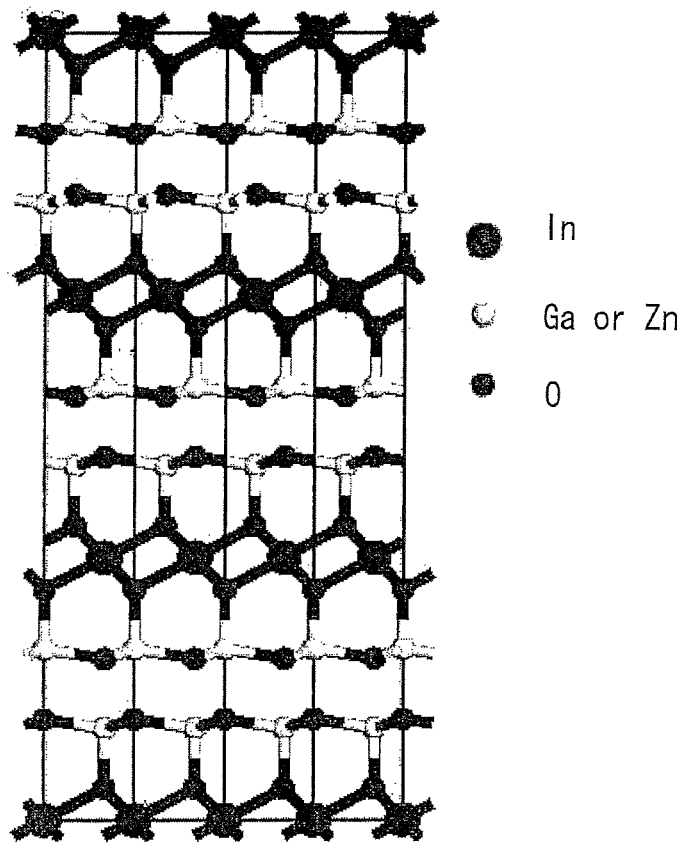
FIGS. 12A and 12B are diagrams each illustrating a crystal structure of an oxide material according to one embodiment of the present invention.

In the case where n=1 ($InGaZnO_4$), a crystal structure illustrated in FIG. 12A can be obtained, for example. Note that in the crystal structure in FIG. 12A, since a Ga atom and an In atom each have five ligands as described with FIG. 9B, a structure in which Ga is replaced with In can be obtained.

Figure 12B:
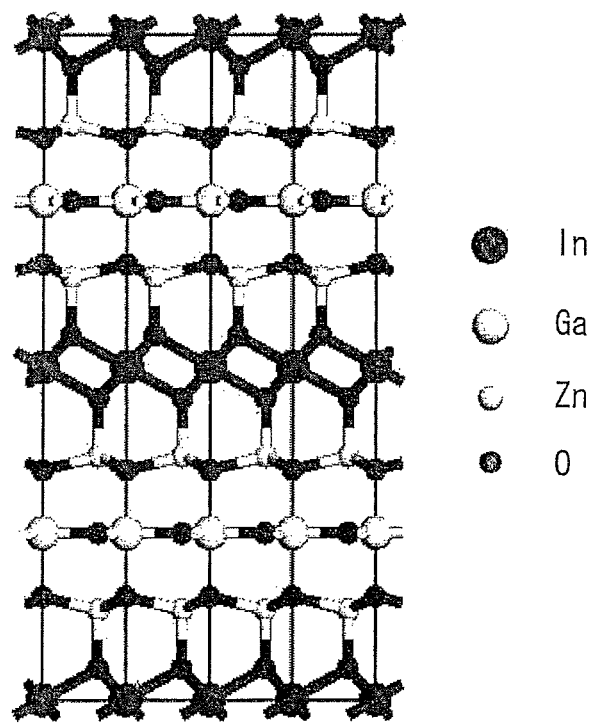

In the case where n=2 ($InGaZn_2O_5$), a crystal structure illustrated in FIG. 12B can be obtained, for example. Note that in the crystal structure in FIG. 12B, since a Ga atom and an In atom each have five ligands as described with FIG. 9B, a structure in which Ga is replaced with In can be obtained.

Here, as the oxide semiconductor film 227, an oxide semiconductor film having an amorphous structure is formed by a sputtering method.

As a target used in a sputtering method, a metal oxide target containing zinc can be used. As the target, a four-component metal oxide such as an In—Sn—Ga—Zn-based metal oxide, a three-component metal oxide such as an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, or a Sn—Al—Zn-based metal oxide, a two-component metal oxide such as an In—Zn-based metal oxide or a Sn—Zn-based metal oxide, or a single-component metal oxide such as a zinc oxide or a tin oxide can be used.

As an example of the target, a metal oxide target containing In, Ga, and Zn has a composition ratio where $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used. Alternatively, a target having a composition ratio where $In_2O_3:ZnO=25:1$ to 1:4 [molar ratio] can be used.

In the case of forming a film of an In—Ga—Zn—O-based material as the oxide semiconductor film 227 by a sputtering method, it is preferable to use an In—Ga—Zn—O target having the following atomic ratio: the atomic ratio of In:Ga:Zn is 1:1:1, 4:2:3, 3:1:2, 1:1:2, 2:1:3, or 3:1:4. When an oxide semiconductor film 227 is formed using an In—Ga—Zn—O target having the aforementioned atomic ratio, a polycrystal or a CAAC-OS is easily formed.

In the case of forming the oxide semiconductor film 227 using an In—Sn—Zn—O-based material by a sputtering method, it is preferable to use an In—Sn—Zn—O target having an atomic ratio where In:Sn:Zn=1:1:1, 2:1:3, 1:2:2, or 20:45:35. When the oxide semiconductor film 227 is formed using an In—Sn—Zn—O target having the aforementioned atomic ratio, a polycrystal or a CAAC-OS is easily formed.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. It is preferable that a high-purity gas from which impurities including hydrogen are removed be used as a sputtering gas.

In a sputtering method, an RF power supply device, an AC power supply device, a DC power supply device, or the like can be used as a power supply device for generating plasma as appropriate.

The leakage rate of a treatment chamber in which the oxide semiconductor film is formed is preferably lower than or equal to $1 \times 10^{-10}$ Pa·m$^3$/sec., whereby entry of an impurity into the film to be formed by a sputtering method can be decreased.

Evacuation of the treatment chamber where an oxide semiconductor film is formed is preferably performed with a rough vacuum pump, such as a dry pump, and a high vacuum pump, such as a sputter ion pump, a turbo molecular pump, or a cryopump, in appropriate combination. The turbo molecular pump has an outstanding capability in evacuating a large-sized molecule, whereas it has a low capability in evacuating hydrogen or moisture. Further, combination with a cryopump having a high capability in evacuating moisture or a sputter ion pump having a high capability in evacuating hydrogen is effective.

An adsorbate inside the treatment chamber where an oxide semiconductor film is formed does not affect the pressure in the treatment chamber because it is adsorbed on the inner wall, but leads to release of gas at the time of the evacuation of the treatment chamber. Therefore, although the leakage rate and the evacuation rate do not have a correlation, it is important that the adsorbate present in the treatment chamber be desorbed as much as possible and evacuation be performed in advance with use of a pump having high evacuation capability. Note that the treatment chamber may be subjected to baking for promotion of desorption of the adsorbate. By the baking, the rate of desorption of the adsorbate can be increased about tenfold. The baking should be performed at a temperature higher than or equal to 100° C. and lower than or equal to 450° C. At this time, when the adsorbate is removed while an inert gas is introduced, the rate of desorption of moisture or the like, which is difficult to desorb only by evacuation, can be further increased.

As described above, in the process for forming the oxide semiconductor film and preferably in the process for forming the oxide insulating film, entry of impurities is suppressed as much as possible through control of the pressure of the treatment chamber, leakage rate of the treatment chamber, and the like, whereby entry of impurities including hydrogen into the oxide semiconductor film can be reduced. In addition, diffusion of impurities such as hydrogen from the oxide insulating film to the oxide semiconductor film can be reduced.

Note that before the oxide semiconductor film is formed by a sputtering apparatus, a dummy substrate may be put into the sputtering apparatus, and an oxide semiconductor film may be formed over the dummy substrate, so that hydrogen and moisture attached to the target surface or a deposition shield may be removed.

Hydrogen contained in the oxide semiconductor is reacted with oxygen bonded to a metal atom to be moisture, and in addition, a vacancy is formed in a lattice from which oxygen is eliminated (or a portion from which oxygen is removed). Thus, the impurities containing hydrogen are reduced as much as possible in the formation step of the oxide semiconductor film, whereby vacancies in the oxide semiconductor film can be reduced. Therefore, when a channel region is formed using an oxide semiconductor film which is highly purified by removing impurities as much as possible, a highly reliable transistor can be provided.

Next, by performing heat treatment, hydrogen is released from the oxide semiconductor film 227 and part of oxygen contained in the insulating film 225 is diffused into the oxide semiconductor film and the vicinity of the interface between the oxide insulating film 225 and the oxide semiconductor film. As a result, in a transistor formed later, an oxide semiconductor film 228 with low hydrogen concentration can be formed (see FIG. 6C), and oxygen vacancies in the vicinity of the interface between the insulating film 225 and the oxide semiconductor film 228 is reduced.

The temperature of the heat treatment is preferably a temperature at which hydrogen is released from the oxide semiconductor film 227 and part of oxygen contained in the insulating film 225 is released and diffused into the oxide semiconductor film 227. The temperature is typically higher than or equal to 150° C. and lower than the strain point of the substrate, preferably higher than or equal to 250° C. and lower than or equal to 450° C., further preferably higher than or equal to 300° C. and lower than or equal to 450° C.

A rapid thermal annealing (RTA) apparatus can be used for the heat treatment. With of an RTA apparatus, the heat treatment can be performed at a temperature higher than or equal to the strain point of the substrate if the heating time is short. Therefore, time to release hydrogen from the oxide semiconductor film and to diffuse oxygen from the insulating film 225 into the oxide semiconductor film can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere. The treatment time is three minutes to 24 hours. Alternatively, heat treatment may be performed in a reduced atmosphere or an inert gas atmosphere first, and then heat treatment may be performed in an oxygen atmosphere. When the heat treatment is performed in a reduced pressure atmosphere or an inert atmosphere, the impurity concentration in the oxide semiconductor film 227 can be reduced; however, oxygen vacancies are caused at the same time. By the heat treatment in the oxidation atmosphere, the caused oxygen vacancies can be reduced.

By performing heat treatment on the oxide semiconductor film 227, the impurity level in the film can be significantly reduced. Accordingly, the field-effect mobility of the transistor can be increased so as to be close to ideal field-effect mobility to be described later.

Next, part of the oxide semiconductor film 228 is selectively etched, so that an oxide semiconductor film 229 is formed. Then, an insulating film 231 is formed over the oxide semiconductor film 229 by a sputtering method, a CVD method, or the like. Then, a gate electrode 233 is formed over the insulating film 231 (see FIG. 7A).

The insulating film 231 may be formed with a single layer or a stacked layer using, for example, one or more of silicon oxide, silicon oxynitride, silicon nitride oxide, silicon nitride, aluminum oxide, hafnium oxide, gallium oxide, a Ga—Zn—O-based metal oxide, and the like. The insulating film 231 may also be an oxide insulating film from which oxygen is released by heating, like the insulating film 225. By using a film from which oxygen is released by heating as the insulating film 231, oxygen vacancies formed in the oxide semiconductor film 229 can be reduced by heat treatment performed later, and deterioration in electric characteristics of the transistor can be suppressed.

The insulating film 231 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current can be decreased even when the thickness of the gate insulating film is decreased.

The thickness of the insulating film 231 is preferably greater than or equal to 10 nm and less than or equal to 300 nm, further preferably greater than or equal to 5 nm and less than or equal to 50 nm, still further preferably greater than or equal to 10 nm and less than or equal to 30 nm.

The gate electrode 233 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese or zirconium may be used. Further, the gate electrode 233 may have a single-layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The gate electrode 233 is formed by a printing method or an inkjet method. Alternatively, the gate electrode 233 is formed in such a manner that a conductive film is formed by a sputtering method, a CVD method, an evaporation method, or the like and part of the conductive film is selectively etched.

As a material layer in contact with the insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode 233 and the insulating film 231. These films each have a work function higher than or equal to 5 eV, preferably higher than or equal to 5.5 eV; thus, the threshold voltage of the electric characteristics of the transistor can be positive. Accordingly, a so-called normally-off switching element can be obtained. For example, in the case of using an In—Ga—Zn—O film containing nitrogen, an In—Ga—Zn—O film having at least a higher nitrogen concentration than the oxide semiconductor film 229, or specifically, an In—Ga—Zn—O film having a nitrogen concentration of 7 at. % or higher can be used.

After that, heat treatment is preferably performed. By this heat treatment, oxygen can be diffused from the insulating film 225 and the insulating film 231 to the oxide semiconductor film 229 so as to fill oxygen vacancies in the oxide semiconductor film 229, and accordingly the oxygen vacancies can be reduced.

Figure 7A:
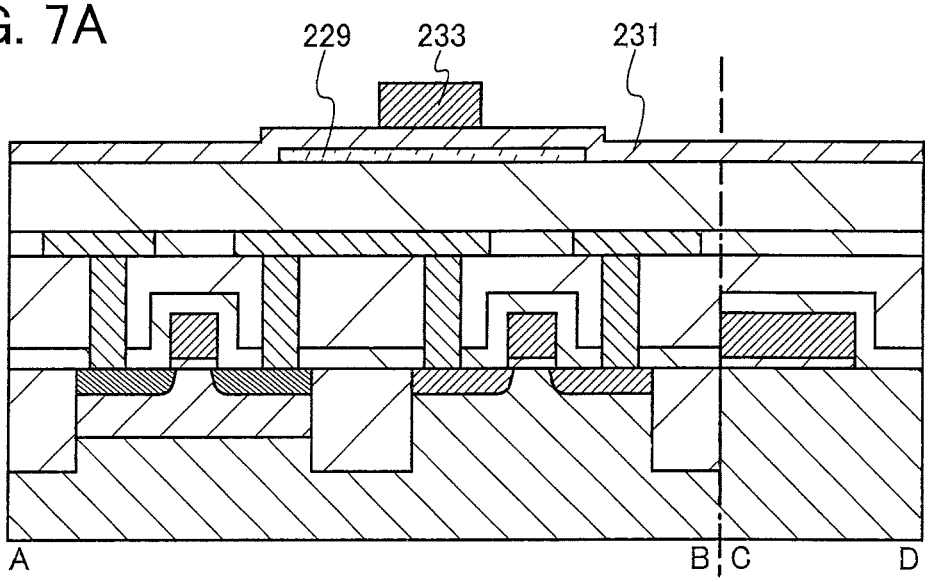
FIGS. 7A to 7C are cross-sectional views illustrating the method for manufacturing a semiconductor device according to one embodiment of the present invention.
Figure 7B:
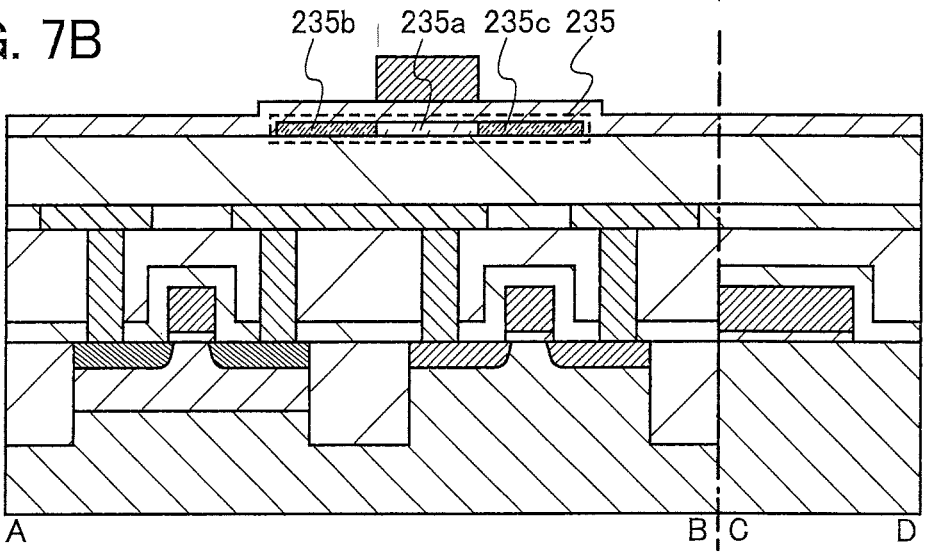

Next, with use of the gate electrode 233 as a mask, dopant is added to the oxide semiconductor film 229. As a result, a first region 235a which is covered with the gate electrode 233 and does not include the dopant and a pair of second regions 235b and 235c which include the dopant are formed as illustrated in FIG. 7B. Since the gate electrode 233 is used as a mask when the dopant is added, the first region 235a to which the dopant is not added and the pair of second regions 235b and 235c including dopant can be formed in a self-aligned manner. The first region 235a overlapping with the gate electrode 233 functions as a channel region. With the pair of second regions 235b and 235c including dopant, a source-drain breakdown voltage can be increased. The oxide semiconductor film 235 is constituted by the first region 235a and the pair of second regions 235b and 235c including dopant.

Further, the concentration of hydrogen in the first region 235a of the oxide semiconductor film 229 is preferably lower than $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, still further preferably lower than or equal to $1 \times 10^{16}$ atoms/cm$^3$. By a bond of an oxide semiconductor and hydrogen, part of contained hydrogen serves as a donor to generate electrons as carriers. For that reason, by a reduction in the concentration of hydrogen in the first region 235a of the oxide semiconductor film 229, a negative shift of the threshold voltage can be reduced.

The concentration of the dopant in the pair of second regions 235b and 235c is higher than or equal to $5 \times 10^{18}$ atoms/cm$^3$ and lower than or equal to $1 \times 10^{22}$ atoms/cm$^3$, preferably higher than or equal to $5 \times 10^{18}$ atoms/cm$^3$ and lower than $5 \times 10^{19}$ atoms/cm$^3$.

Since the pair of second regions 235b and 235c include dopant, the carrier density or the number of defects can be increased. Therefore, the conductivity thereof can be higher than that of the first region 235a which does not include dopant. Note that an excessive increase in the concentration of dopant causes inhibition of carrier movement by the dopant, which leads to a reduction in conductivity of the pair of second regions 235b and 235c including dopant.

The pair of second regions 235b and 235c including dopant preferably has a conductivity of higher than or equal to 0.1 S/cm and lower than or equal to 1000 S/cm, preferably higher than or equal to 10 S/cm and lower than or equal to 1000 S/cm.

The existence of the pair of second regions 235b and 235c including dopant in the oxide semiconductor film 229 can relieve an electric field applied to the end portion of the first region 235a functioning as a channel region. Thus, a short-channel effect of the transistor can be suppressed.

The dopant can be added to the oxide semiconductor film 229 by an ion doping method or an ion implantation method.

As the dopant, at least one of boron, nitrogen, phosphorus, and arsenic can be added. Alternatively, as the dopant, at least one of helium, neon, argon, krypton, and xenon can be added. Further alternatively, as the dopant, hydrogen can be added. Still alternatively, as the dopant, at least one of boron, nitrogen, phosphorus, and arsenic and at least one of helium, neon, argon, krypton, and xenon in appropriate combination can be added.

In the embodiment describe here, the addition of the dopant to the oxide semiconductor film 229 is conducted in a state where the oxide semiconductor film 229 is covered with the insulating film and the like; alternatively, the addition of the dopant may be conducted in a state where the oxide semiconductor film 229 is exposed.

Alternatively, the dopant can be added by a method other than an ion doping method, an ion implantation method, or the like. For example, a dopant can be added in the following manner: plasma is generated in an atmosphere of a gas containing an element to be added and plasma treatment is performed on an object to which the dopant is added. A dry etching apparatus, a CVD apparatus, or the like can be used to generate the plasma.

After that, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 235b and 235c including dopant can be reduced. In the heat treatment, the pair of second regions 235b and 235c including dopant may be in either a crystalline state or an amorphous state.

Figure 7C:
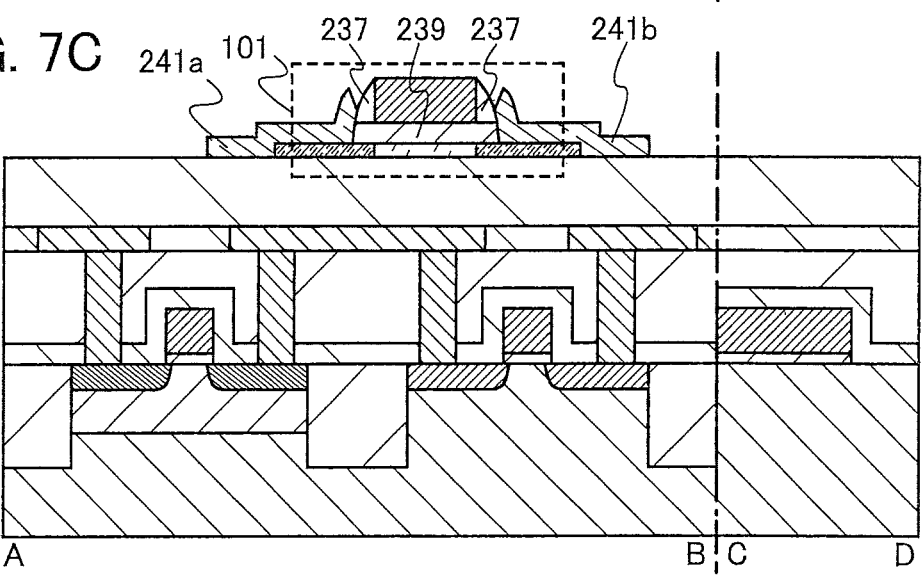

Next, as illustrated in FIG. 7C, sidewall insulating films 237 are formed on side surfaces of the gate electrode 233, and a gate insulating film 239 and electrodes 241a and 241b are formed.

The sidewall insulating films 237 may be, for example, formed with a single layer or a stacked layer using one or more of silicon oxide, silicon oxynitride, silicon nitride oxide, silicon nitride, aluminum oxide, aluminum oxynitride, aluminum nitride oxide, aluminum nitride, and the like. The sidewall insulating films 237 may be formed using an oxide insulating film from which part of oxygen is released by heating in a manner similar to that of the insulating film 225.

A method for forming the sidewall insulating films 237 is described below

First, an insulating film to be the sidewall insulating films 237 is formed over the insulating film 231 and the gate electrode 233. The insulating film is formed by a sputtering method, a CVD method, or the like. In addition, although the thickness of the insulating film is not particularly limited, the thickness is selected as appropriate in consideration of coverage with respect to the shape of the gate electrode 233.

Then, the sidewall insulating films 237 are formed by etching the insulating film. The etching here is highly anisotropic etching, and the sidewall insulating films 237 can be formed in a self-aligned manner by performing the highly anisotropic etching on the insulating film.

The width of the pair of second regions 235b and 235c including dopant depends on the width of the sidewall insulating film 237, and the width of the sidewall insulating films 237 depends on the thickness of the gate electrode 233. Therefore, the thickness of the gate electrode 233 may be determined so that the width of the pair of second regions 235b and 235c has a desired value When the sidewall insulating films 237 are formed, the insulating film 251 is also etched by highly anisotropic etching and the oxide semiconductor film 229 is partly exposed, whereby the gate insulating film 239 is formed.

The pair of electrodes 241a and 241b can be formed using a material similar to that of the wirings 223a to 223c, as appropriate. Note that the pair of electrodes 241a and 241b may serve as wirings.

The pair of electrodes 241a and 241b is formed by a printing method or an inkjet method. Alternatively, a conductive film is deposited by a sputtering method, a CVD method, an evaporation method, or the like, and then the part of the conductive film is selectively etched, so that the pair of electrodes 241a and 241b is formed.

The pair of electrodes 241a and 241b is preferably formed to be in contact with the side surfaces of the sidewall insulating films 237 and the gate insulating film 239. That is, end portions of the pair of electrodes 241a and 241b of the transistor are located over the sidewall insulating films 237 and entirely cover exposed portions of the pair of second regions 235b and 235c including dopant in the oxide semiconductor film 229. As a result, regions in the pair of second regions 235b and 235c including dopant which are in contact with the pair of electrodes 241a and 241b serve as a source region and a drain region. In addition, with regions in the pair of second regions 235b and 235c including dopant which overlap with the sidewall insulating films 237 and the gate insulating film 239, a source-drain breakdown voltage can be increased. Further, the distance between a source and a drain can be adjusted depending on the length of the sidewall insulating films 237; thus, end portions of the electrodes 241a and 241b, which are on the channel side and in contact with the oxide semiconductor film 229, can be formed without a mask. Since a mask is not used, differences of shapes among a plurality of transistors generated in processing can be reduced.

Through the above steps, a transistor including an oxide semiconductor film which can be used as a switch can be manufactured.

Figure 8A:
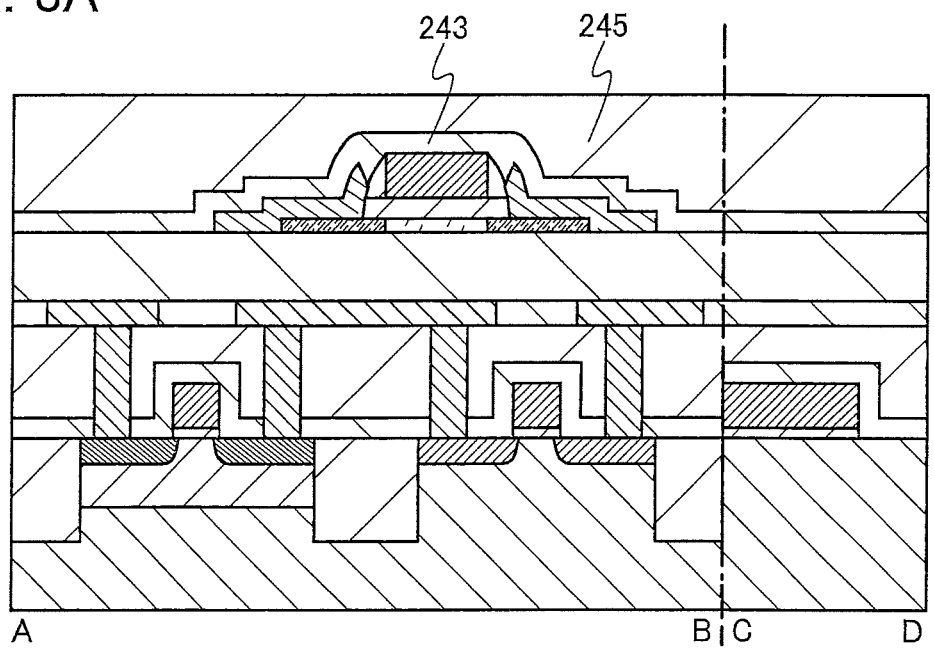
FIGS. 8A and 8B are cross-sectional views illustrating the manufacturing method of a semiconductor device according to one embodiment of the present invention.
Figure 8B:
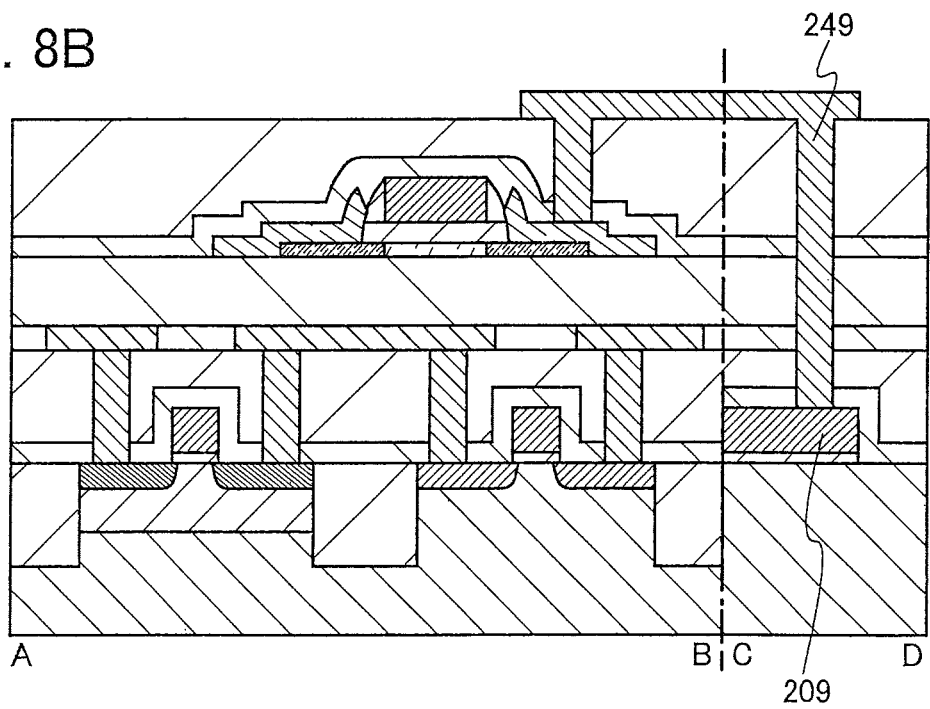

Next, as illustrated in FIG. 8A, an insulating film 243 and an insulating film 245 are formed by a sputtering method, a CVD method, a coating method, a printing method, or the like.

The insulating films 243 and 245 each may be formed to have a single layer or a stacked layer using one or more of silicon oxide, silicon oxynitride, silicon nitride oxide, silicon nitride, aluminum oxide, aluminum oxynitride, aluminum nitride oxide, aluminum nitride, and the like. When the insulating film 245 is formed to function as an insulating film which prevents diffusion of oxygen to the outside, oxygen released from the insulating film 243 can be supplied to the oxide semiconductor film. Typical examples of an insulating film which prevents diffusion of oxygen to the outside include an aluminum oxide film and an aluminum oxynitride film. In addition, by using an insulating film which prevents diffusion of hydrogen from the outside as the insulating film 245, diffusion of hydrogen from the outside to the oxide semiconductor film can be reduced, and deficiency in the oxide semiconductor film can be reduced. Typical examples of the insulating film which prevents diffusion of hydrogen from the outside include films of silicon nitride, silicon nitride oxide, aluminum nitride, and aluminum nitride oxide. Further, the insulating film 243 has a three-layer structure in which an oxide insulating film, like the insulating film 225, from which part of oxygen is released by heating, an insulating film which prevents diffusion of oxygen to the outside, and an oxide insulating film are provided. Thus, oxygen can be efficiently diffused to the oxide semiconductor film, and release of oxygen to the outside can be suppressed. Accordingly, variation in characteristics of transistors can be reduced even at high temperature and at high humidity.

Through the above steps, a transistor including an oxide semiconductor film can be manufactured.

Next, parts of the insulating films 215, 217, 221e, 243, and 245 are each selectively etched to form opening portions, so that the gate electrode 209 and one of the pair of electrodes are partly exposed. Next, a conductive film is formed in the opening portions, and then part of the conductive film is selectively etched to form a wiring 249. The wiring 249 can be formed using a material used for the contact plugs 219a to 219d as appropriate.

Through the above steps, the other of the source and the drain of the first transistor 101 including an oxide semiconductor film can be connected to the gate of the eighth transistor 108 that is an n-channel transistor.

In a latch circuit included in a semiconductor device, a transistor which includes a channel region formed in an oxide semiconductor film can be stacked over a transistor which includes a semiconductor substrate or a semiconductor film provided over an insulating substrate. As a result, high integration of the semiconductor device can be achieved.

This embodiment can be implemented in appropriate combination with any of the other embodiments.

(Embodiment 4)

In this embodiment, a method for forming the oxide semiconductor film 229 described in Embodiment 3 using a CAAC-OS will be described.

A first method for forming the oxide semiconductor film 229 using a CAAC-OS is described below.

In the case where a sputtering method is employed in the method for forming the oxide semiconductor film 227 illustrated in FIG. 6B described in Embodiment 3 in forming the oxide semiconductor film 229 using a CAAC-OS, the substrate temperature is set to be higher than or equal to 150° C. and lower than or equal to 450° C., preferably higher than or equal to 200° C. and lower than or equal to 350° C., so that entry of hydrogen, moisture, and the like to the oxide semiconductor film can be reduced and a CAAC-OS can be formed.

Heat treatment is performed after the oxide semiconductor film is formed using a CAAC-OS by the above-described method, whereby hydrogen, moisture, and the like can be further released from the oxide semiconductor film 227, part of oxygen contained in the insulating film 225 can be diffused into the oxide semiconductor film 227 and the vicinity of the interface between the insulating film 225 and the oxide semiconductor film 227, and the oxide semiconductor film 228 including a CAAC-OS with a high crystallinity can be formed. Then, part of the oxide semiconductor film 228 is selectively etched, so that the oxide semiconductor film 229 can be formed.

Next, a second method for forming the oxide semiconductor film 229 using a CAAC-OS is described.

A first oxide semiconductor film is formed over the insulating film 225. The thickness of the first oxide semiconductor film is greater than or equal to a thickness of one atomic layer and less than or equal to 10 nm, preferably greater than or equal to 2 nm and less than or equal to 5 nm.

The first oxide semiconductor film is formed in an oxygen gas atmosphere at a substrate heating temperature higher than or equal to 100° C. and lower than or equal to 600° C., preferably higher than or equal to 150° C. and lower than or equal to 550° C., and further preferably higher than or equal to 200° C. and lower than or equal to 500° C. As the substrate heating temperature at the tune of film formation is higher, the impurity concentration of the obtained oxide semiconductor film is lower. Further, entry of impurities such as hydrogen and moisture in the formed first oxide semiconductor film can be reduced. Further, the atomic arrangement in the oxide semiconductor film is ordered, and the density thereof is increased, so that a polycrystal or a CAAC-OS is readily formed. Furthermore, since an oxygen gas atmosphere is employed for the film formation, an unnecessary atom is not contained in the oxide semiconductor film unlike in the case of employing a rare gas atmosphere or the like, so that a polycrystal or a CAAC-OS is readily formed. Note that a mixed gas atmosphere including an oxygen gas and a rare gas may be used. In that case, the percentage of an oxygen gas is higher than or equal to 30 vol. %, preferably higher than or equal to 50 vol. %, further preferably higher than or equal to 80 vol. %. As the oxide semiconductor film is thinner, the short channel effect of the transistor can be reduced. However, when the oxide semiconductor film is too thin, the oxide semiconductor film is significantly influenced by interface scattering; thus, the field effect mobility might be decreased.

After the first oxide semiconductor film is formed, first heat treatment may be performed. Through the first heat treatment, hydrogen, moisture, and the like can be removed from the first oxide semiconductor film, and the crystallinity thereof can be further improved. By the first heat treatment, a CAAC-OS film with high orientation can be formed. The first heat treatment is performed at a temperature higher than or equal to 200° C. and lower than the strain point of the substrate, preferably higher than or equal to 250° C. and lower than or equal to 450° C.

For the first heat treatment, a rapid thermal annealing (RTA) apparatus can be used. With use of the RTA apparatus, only in a short time, the heat treatment can be performed at a temperature higher than or equal to the strain point of the substrate. Therefore, time to form an oxide semiconductor film in which the proportion of a crystalline region is higher than that of an amorphous region can be shortened.

The first heat treatment can be performed in an inert gas atmosphere; preferably, in a rare gas (such as helium, neon, argon, xenon, or krypton) atmosphere or a nitrogen atmosphere. Alternatively, the heat treatment may be performed in an oxygen atmosphere or a reduced-pressure atmosphere. The treatment time is three minutes to 24 hours. As the treatment time is increased, the proportion of a crystal region with respect to that of an amorphous region in the oxide semiconductor film can be increased. Note that heat treatment for longer than 24 hours is not preferable because the productivity is decreased.

Next, a second oxide semiconductor film is formed over the first oxide semiconductor film. The second oxide semiconductor film can be formed by a method similar to that for the first oxide semiconductor film When the substrate is heated while the second oxide semiconductor film is formed, the second oxide semiconductor film can be crystallized with use of the first oxide semiconductor film as a seed crystal. At this time, the formation of the first oxide semiconductor film and the second oxide semiconductor film both including the same element is referred to as "homoepitaxial growth". The formation of the first oxide semiconductor film and the second oxide semiconductor film including at least one different element from each other is referred to as "heteroepitaxial growth".

After formation of the second oxide semiconductor film, second heat treatment may be performed. The second heat treatment may be performed in a manner similar to that of the first heat treatment. By the second heat treatment, an oxide semiconductor film in which the proportion of a crystalline region is higher than that of an amorphous region can be formed. Alternatively, with the second heat treatment, the second oxide semiconductor film can be crystallized using the first oxide semiconductor film as a seed crystal.

As described above, after the oxide semiconductor film 227 is formed using a CAAC-OS in which entry of hydrogen, moisture, and the like is reduced, heat treatment is performed, whereby hydrogen, moisture, and the like is released from the oxide semiconductor film 227, and part of oxygen contained in the insulating film 225 can be diffused to the oxide semiconductor film 227 and in the vicinity of interface between the insulating film 225 and the oxide semiconductor film 227. Thus, by the heat treatment, the oxide semiconductor film 228 with high crystallinity can be formed using a CAAC-OS. Then, part of the oxide semiconductor film 228 is selectively etched, so that the oxide semiconductor film 229 can be formed.

Hydrogen contained in the oxide semiconductor is reacted with oxygen bonded to a metal atom to be moisture, and in addition, a vacancy is formed in a lattice from which oxygen is eliminated (or a portion from which oxygen is removed). Thus, impurities are reduced as much as possible in the formation step of the oxide semiconductor film, whereby vacancies in the oxide semiconductor film can be reduced. Therefore, by using an oxide semiconductor film which is a CAAC-OS film that is highly purified through removal of the impurities as much as possible for a channel region, the amount of change in threshold voltage of the transistor before and after light irradiation or the BT (bias temperature) stress test is small, whereby the transistor can have stable electric characteristics.

This embodiment can be implemented in appropriate combination with any of the other embodiments.

(Embodiment 5)

In this embodiment, the field-effect mobility of a transistor that uses an oxide semiconductor film for a channel region will be described.

The actually measured field-effect mobility of a transistor can be lower than its intrinsic field-effect mobility because of a variety of reasons; this phenomenon occurs not only in the case of using an oxide semiconductor. One of the reasons that reduce the field-effect mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the field-effect mobility $\mu$ can be expressed as Formula 2 shown below.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height of the potential barrier (E) can be expressed as the following formula according to the Levinson model.

$$E = \frac{e^2 N^2}{8\varepsilon n} = \frac{e^3 N^2 t}{8\varepsilon C_{ox} V_g} \quad \text{[Formula 3]}$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor film is less than or equal to 30 nm, the thickness of the channel may be regarded as being the same as the thickness of the semiconductor film. The drain current $I_d$ in a linear region can be expressed as the following formula.

$$I_d = \frac{W \mu V_g V_d C_{ox}}{L} \exp\left(-\frac{E}{kT}\right) \quad \text{[Formula 4]}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the drain current $I_d$ is expressed as the following formula.

$$\ln\left(\frac{I_d}{V_g}\right) = \ln\left(\frac{W \mu V_d C_{ox}}{L}\right) - \frac{E}{kT} \quad \text{[Formula 5]}$$
$$= \ln\left(\frac{W \mu V_d C_{ox}}{L}\right) - \frac{e^3 N^2 t}{8kT \varepsilon C_{ox} V_g}$$

The right side of the Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}$/cm$^2$.

On the basis of the defect density obtained in this manner, or the like, $\mu_0$ can be calculated to be 120 cm$^2$/Vs from Formula 2 and Formula 3. The measured field-effect mobility of an In—Sn—Zn oxide including a defect is approximately 40 cm$^2$/Vs. However, assuming that no defect exists inside the semiconductor and at the interface between the semiconductor and an insulating film, the filed-effect mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the field-effect mobility $\mu_1$ at a position that is distance x away from the interface between the semiconductor and the gate insulating film can be expressed as the following formula.

$$\frac{1}{\mu_1} = \frac{1}{\mu_0} + \frac{D}{B} \exp\left(-\frac{x}{G}\right) \quad \text{[Formula 6]}$$

Here, D represents the electric field in the gate direction, and B and G are constants. B and G can be obtained from actual measurement results; according to the above measurement results, B is 4.75×10⁷ cm/s and G is 10 nm (the depth to which the influence of interface scattering reaches). When D is increased (i.e., when the gate voltage is increased), the second term of Formula 6 is increased and accordingly the field-effect mobility $\mu_1$ is decreased.

Figure 13:
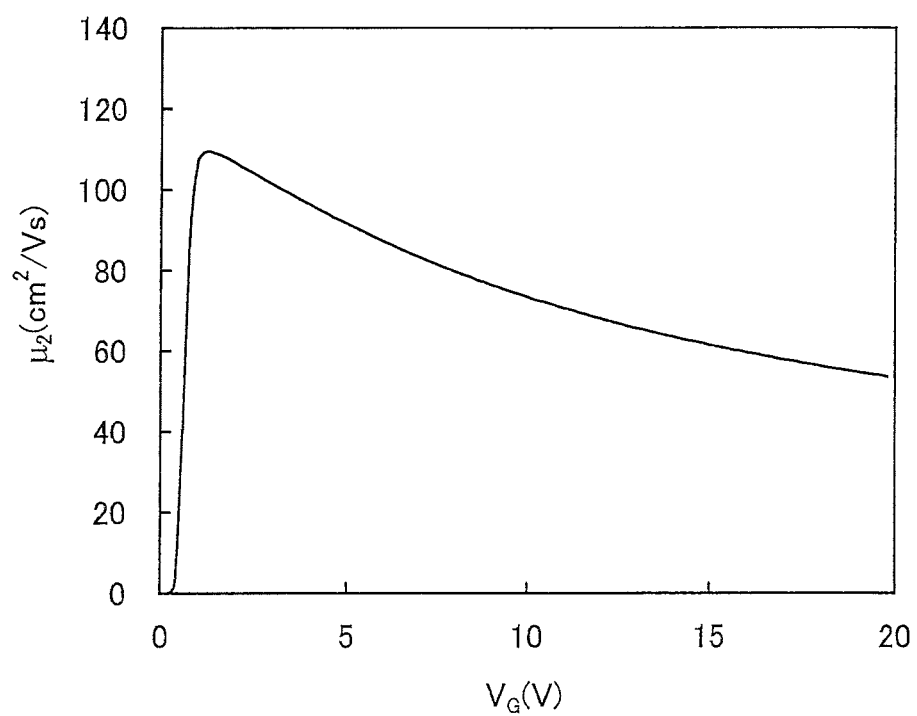
FIG. 13 shows the gate voltage dependence of field-effect mobility obtained by calculation.

Calculation results of the field-effect mobility $\mu_2$ of a transistor whose channel is formed using an ideal oxide semiconductor film without a defect inside the semiconductor are shown in FIG. 13. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 µm, and the drain voltage $V_d$ was assumed to be 0.1 V.

As shown in FIG. 13, the field-effect mobility has a peak of more than 100 cm²/Vs at a gate voltage that is a little over 1 V and is decreased as the gate voltage becomes higher because the influence of interface scattering is increased. Note that in order to reduce interface scattering, it is preferable that a surface of the semiconductor film be flat at the atomic level (atomic layer flatness).

Calculation results of characteristics of minute transistors which are manufactured using an oxide semiconductor having such a filed-effect mobility are shown in FIGS. 14A to 14C, FIGS. 15A to 15C, and FIGS. 16A to 16C. FIGS. 17A and 17B illustrate cross-sectional structures of transistors used for calculation. In each of the transistors illustrated in FIGS. 17A and 17B, an n-type impurity semiconductor region 1103a and an n-type impurity semiconductor region 1103c are included in an oxide semiconductor film. The resistivities of the impurity semiconductor region 1103a and the impurity semiconductor region 1103c are 2×10⁻³ Ωcm.

The transistor in FIG. 17A is formed over a base insulating film 1101 and an embedded insulator 1102 that is embedded in the base insulating film 1101 and formed of aluminum oxide. The transistor includes the impurity semiconductor region 1103a, the impurity semiconductor region 1103c, an intrinsic semiconductor region 1103b functioning as a channel formation region therebetween, and a gate electrode 1105. The width of the gate electrode 1105 (that is, the channel length) is 33 nm.

A gate insulating film 1104 is formed between the gate electrode 1105 and the semiconductor region 1103b. In addition, a sidewall insulating film 1106a and a sidewall insulating film 1106b are formed on both side surfaces of the gate electrode 1105, and an insulator 1107 is formed over the gate electrode 1105 so as to prevent a short circuit between the gate electrode 1105 and another wiring. The sidewall insulating film has a width of 5 nm. A source electrode 1108a and a drain electrode 1108b are provided in contact with the impurity semiconductor region 1103a and the impurity semiconductor region 1103c, respectively. Note that the channel width of this transistor is 40 nm.

The transistor of FIG. 17B is the same as the transistor of FIG. 17A in that it is formed over the base insulating film 1101 and the embedded insulator 1102 formed of aluminum oxide and that it includes the impurity semiconductor region 1103a, the impurity semiconductor region 1103c, the intrinsic semiconductor region 1103b provided therebetween, the gate electrode 1105 having a width (i.e., channel length) of 33 nm, the gate insulating film 1104, the sidewall insulating film 1106a, the sidewall insulating film 1106b, the insulator 1107, the source electrode 1108a, and the drain electrode 1108b.

The transistor illustrated in FIG. 17A is different from the transistor illustrated in FIG. 17B in the conductivity type of semiconductor regions under the sidewall insulating film 1106a and the sidewall insulating film 1106b. In the transistor illustrated in FIG. 17A, the semiconductor regions under the sidewall insulating film 1106a and the sidewall insulating film 1106b are part of the n-type impurity semiconductor region 1103a and part of the n-type semiconductor region 1103c, whereas in the transistor illustrated in FIG. 17B, the semiconductor regions under the sidewall insulating film 1106a and the sidewall insulating film 1106b are part of the intrinsic semiconductor region 1103b. In other words, a region having a width $L_{off}$ which overlaps with neither the impurity semiconductor region 1103a (the impurity semiconductor region 1103c) nor the gate electrode 1105 is provided. This region is called an offset region, and the width $L_{off}$ is called an offset length. As is seen from the drawing, the offset length is equal to the width of the sidewall insulating film 1106a (the sidewall insulating film 1106b).

Figure 14A:
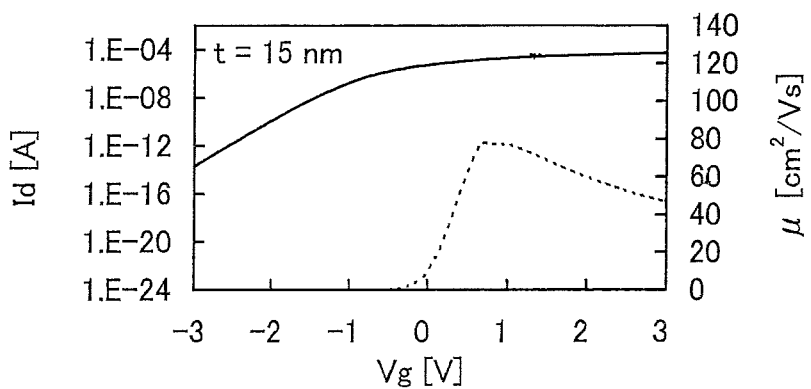
FIGS. 14A to 14C each show the gate voltage dependence of drain current and field-effect mobility obtained by calculation.
Figure 14B:
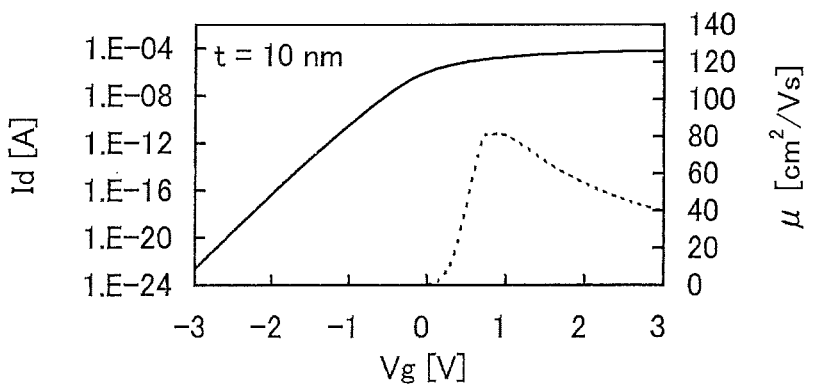
Figure 14C:
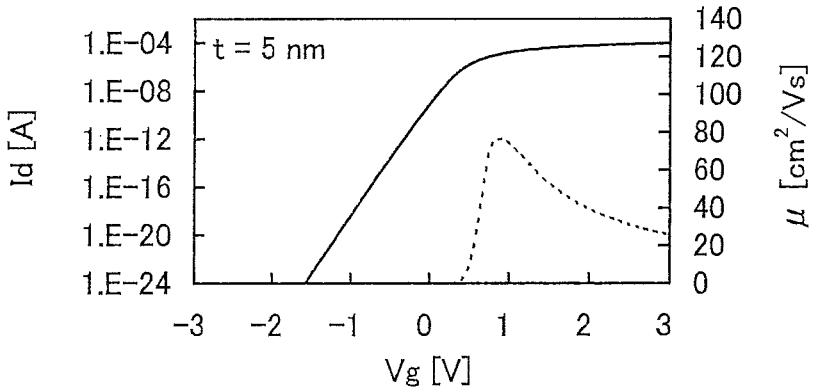

The other parameters used in calculation are as described above. For the calculation, device simulation software Sentaurus Device manufactured by Synopsys, Inc. was used. FIGS. 14A to 14C show the gate voltage $V_g$ (a potential difference between the gate and the source) dependence of the drain current $I_d$ (a solid line) and the field-effect mobility $\mu$ (a dotted line) of the transistor having the structure illustrated in FIG. 17A. The drain current $I_d$ is obtained by calculation under the assumption that the drain voltage (a potential difference between the drain and the source) is +1 V and the field-effect mobility $\mu$ is obtained by calculation under the assumption that the drain voltage is +0.1 V.

FIG. 14A shows the gate voltage dependence of the transistor in the case where the thickness of the gate insulating film is 15 nm, FIG. 14B shows that of the transistor in the case where the thickness of the gate insulating film is 10 nm, and FIG. 14C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the field-effect mobility $\mu$ and the drain current $I_d$ in an on state (on-state current). The graphs show that the drain current exceeds 10 µA at a gate voltage of around 1 V. In other words, the value of the on-state current required for an LSI can be satisfied.

Figure 15A:
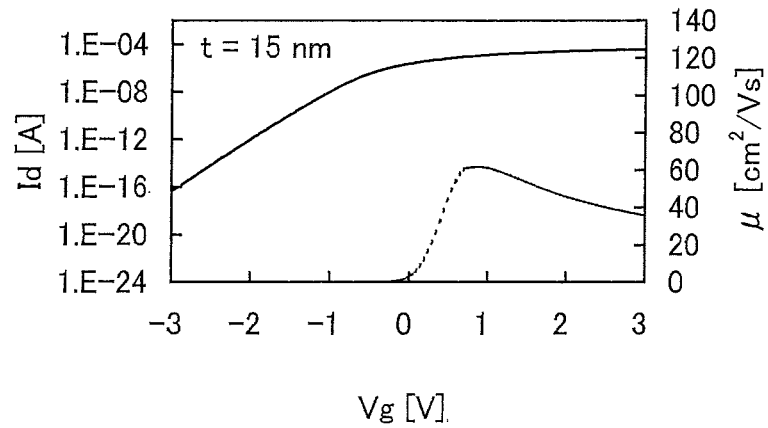
FIGS. 15A to 15C each show the gate voltage dependence of drain current and field-effect mobility obtained by calculation.
Figure 15B:
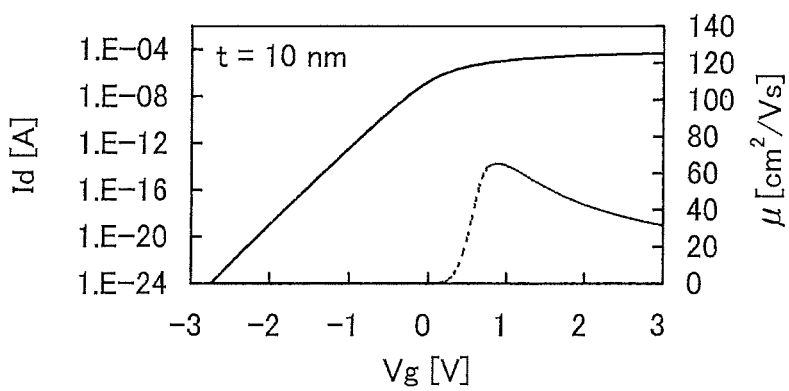
Figure 15C:
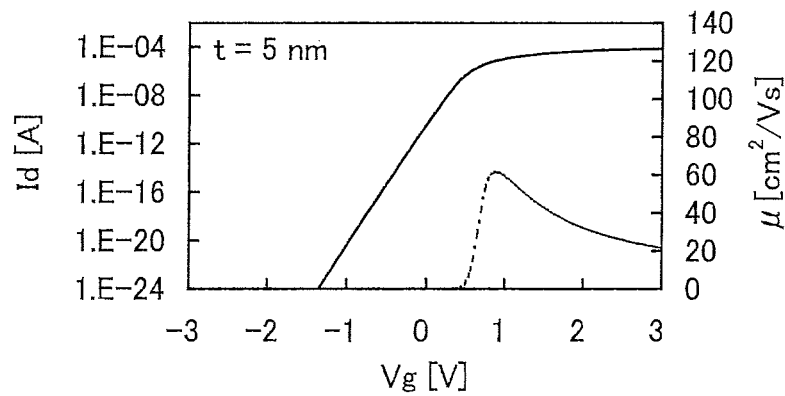

FIGS. 15A to 15C show the gate voltage $V_g$ dependence of the drain current $I_d$ (a solid line) and the field-effect mobility $\mu$ (a dotted line) of the transistor having the structure illustrated in FIG. 17B where the offset length $L_{off}$ is 5 nm. The drain current $I_d$ is obtained by calculation under the assumption that the drain voltage is +1 V and the field-effect mobility $\mu$ is obtained by calculation under the assumption that the drain voltage is +0.1 V. FIG. 15A shows the gate voltage dependence of the transistor in the case where the thickness of the gate insulating film is 15 nm, FIG. 15B shows that of the transistor in the case where the thickness of the gate insulating film is 10 nm, and FIG. 15C shows that of the transistor in the case where the thickness of the gate insulating film is 5 nm.

Figure 16A:
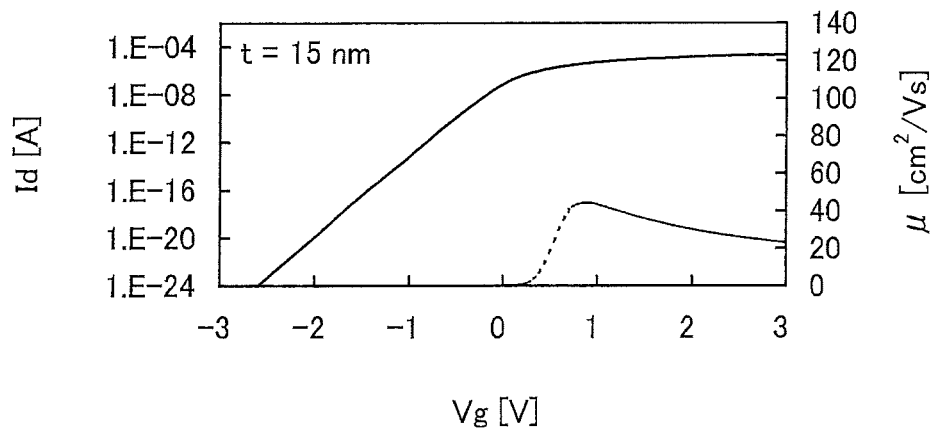
FIGS. 16A to 16C each show the gate voltage dependence of drain current and field-effect mobility obtained by calculation.
Figure 16B:
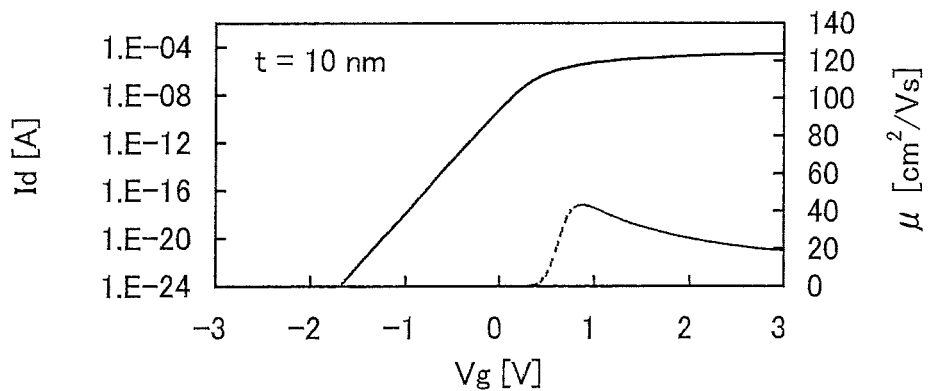
Figure 16C:
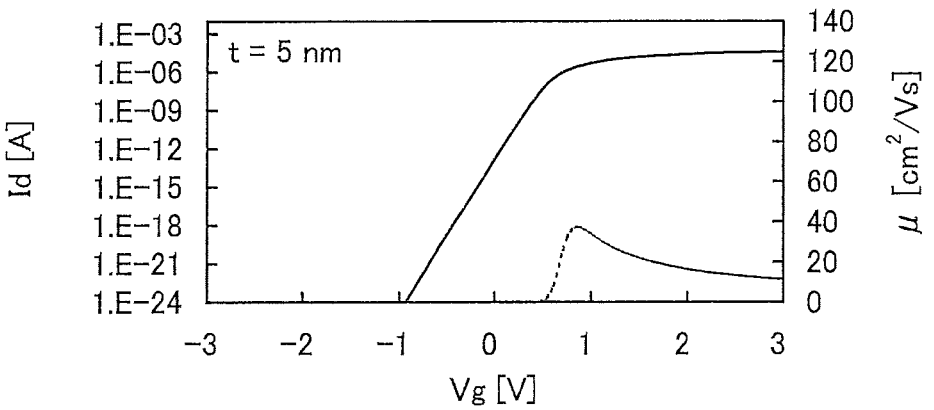
Figure 17A:
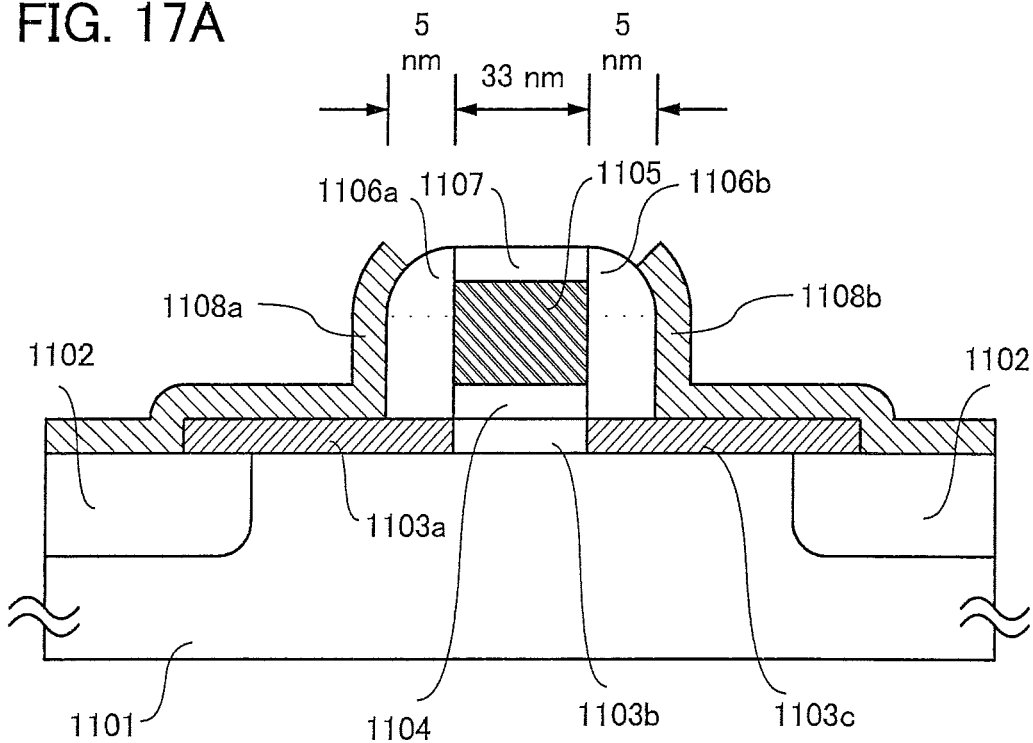
FIGS. 17A and 17B each illustrate a cross-sectional structure of a transistor used for calculation.
Figure 17B:
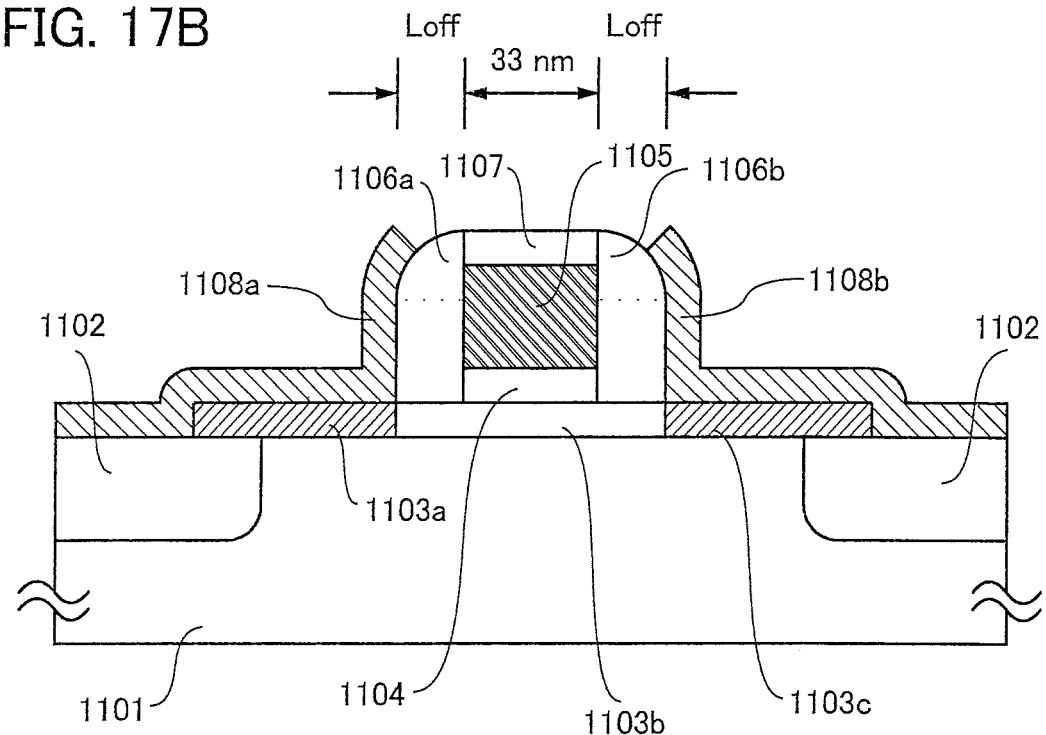

Further, FIGS. 16A to 16C show the gate voltage dependence of the drain current $I_d$ (a solid line) and the field-effect mobility $\mu$ (a dotted line) of the transistor having the structure illustrated in FIG. 17B where the offset length $L_{off}$ is 15 nm.

The drain current $I_d$ is obtained by calculation under the assumption that the drain voltage is +1 V and the field-effect mobility µ is obtained by calculation under the assumption that the drain voltage is +0.1 V. FIG. 16A shows the gate voltage dependence of the transistor in the case where the thickness of the gate insulating film is 15 nm, FIG. 16B shows that of the transistor in the case where the thickness of the gate insulating film is 10 nm, and FIG. 16C shows that of the transistor in the case where the thickness of the gate insulating film is 5 nm.

In either of the structures, as the gate insulating film is thinner, the off-state current is significantly decreased, whereas no noticeable change arises in the peak value of the field-effect mobility µ and the on-state current.

Note that the peak of the field-effect mobility µ is approximately 80 cm$^2$/Vs in FIGS. 14A to 14C, approximately 60 cm$^{21}$Vs in FIGS. 15A to 15C, and approximately 40 cm$^2$/Vs in FIGS. 16A to 16C; thus, the peak of the field-effect mobility µ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 µA at a gate voltage of around 1 V. In other words, the value of the on-state current required for an LSI can be satisfied.

EXAMPLE 1

In this example, electric characteristics and reliability of a transistor in which an oxide semiconductor film including In, Sn, and Zn as main components is used for a channel region will be described.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in composition at 5 at. % or more.

By intentionally heating the substrate during forming the oxide semiconductor film or after formation of the oxide semiconductor film including In, Sn, and Zn as main components, the field-effect mobility of the transistor can be improved. Further, the threshold voltage of the transistor can be positively shifted to make the transistor normally off.

Figure 18A:
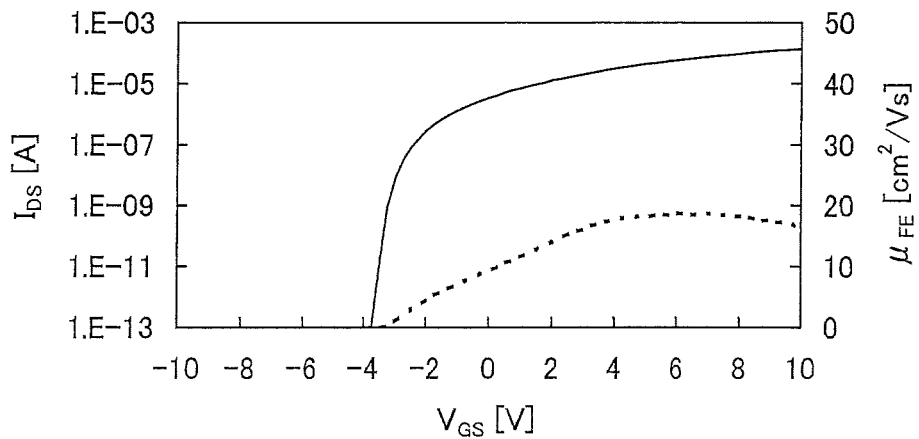
FIGS. 18A to 18C each show the gate voltage dependence of drain current and field-effect mobility in a transistor including an oxide semiconductor film.
Figure 18B:
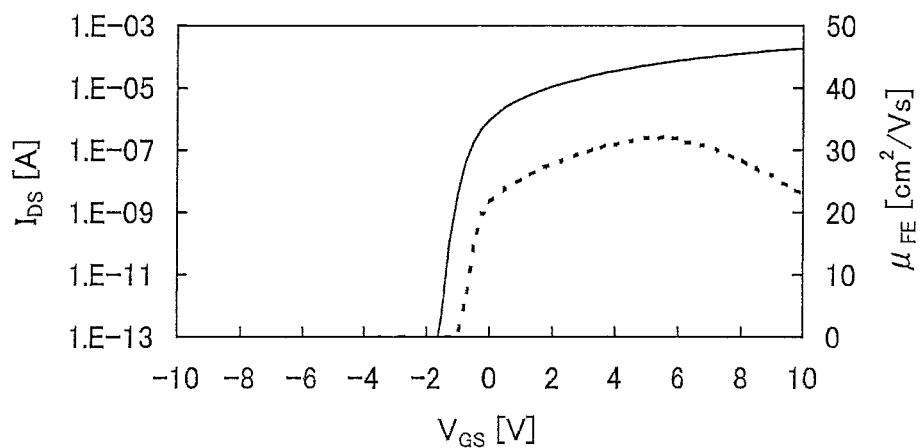
Figure 18C:
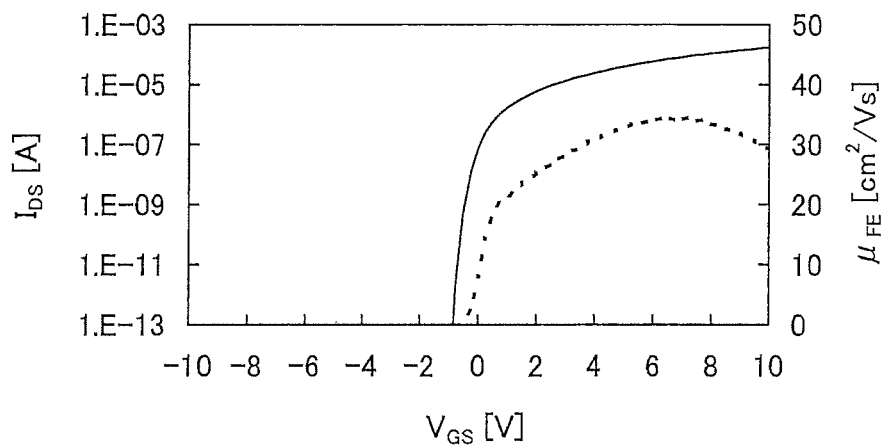

As an example, FIGS. 18A to 18C are graphs each showing characteristics of a transistor in which an oxide semiconductor film including In, Sn, and Zn as main components and having a channel length L of 3 µm and a channel width W of 10 µm, and a gate insulating film with a thickness of 100 nm are used. Note that $V_{ds}$ was set to 10V.

FIG. 18A shows characteristics of a transistor whose oxide semiconductor film including In, Sn, and Zn as main components was formed by a sputtering method without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 18B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 18C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a purified non-single-crystal oxide semiconductor, it is expected that ideally, a field-effect mobility exceeding 100 cm$^2$/Vsec is obtained.

The oxide semiconductor including In, Sn, and Zn as main components may be crystallized in the following manner oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The heating of the substrate during film formation and/or the heat treatment after the film formation contribute(s) not only to improvement of the field-effect mobility but also to make the transistor a normally-off transistor. In a transistor in which an oxide semiconductor film including In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be verified on the basis of comparison between FIGS. 18A and 18B.

Note that the threshold voltage can also be adjusted by changing the ratio of In, Sn, and Zn: when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be lower than ±1.5 V, preferably lower than ±1.0 V.

A BT (bias-temperature) test was performed on the following two transistors: Sample 1 on which heat treatment was not performed after formation of an oxide semiconductor film, and Sample 2 on which heat treatment at 650° C. was performed after formation of an oxide semiconductor film.

First, $V_{gs}$-$I_{ds}$ characteristics of the transistors were measured at a substrate temperature of 25° C. and $V_{ds}$ of 10 V. Note that $V_{ds}$ refers to a drain voltage (a potential difference between a drain and a source). Then, the substrate temperature was set to 150° C. and $V_{ds}$ was set to 0.1 V. After that, $V_{gs}$ of 20 V was applied so that the intensity of an electric field applied to the gate insulating film was 2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT stress test.

In a similar manner, first, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, −20 V of $V_{gs}$ was applied so that the intensity of an electric field applied to the gate insulating film was −2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT stress test.

Figure 19A:
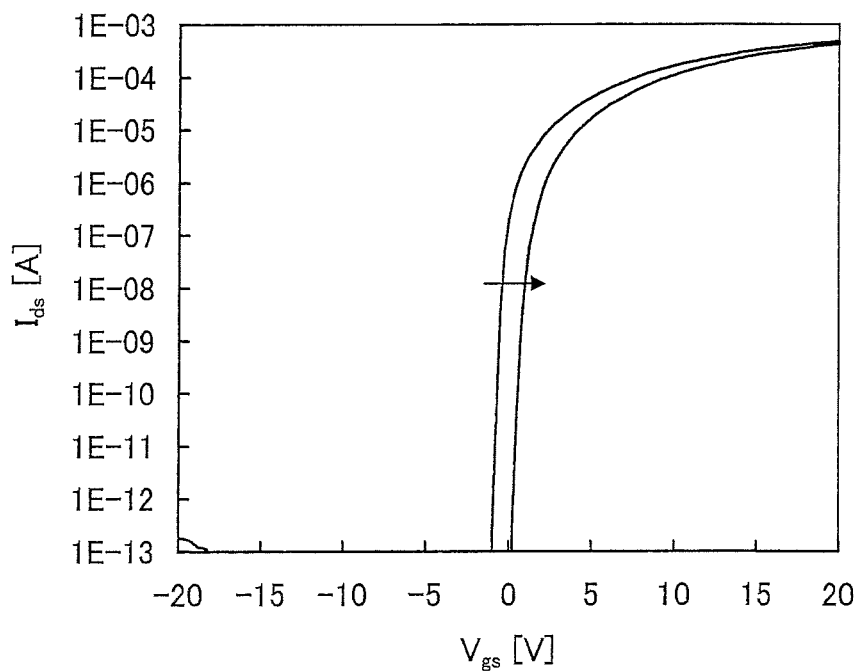
FIGS. 19A and 19B are graphs each showing the drain current of a transistor of Sample 1 after the BT stress test is performed.
Figure 19B:
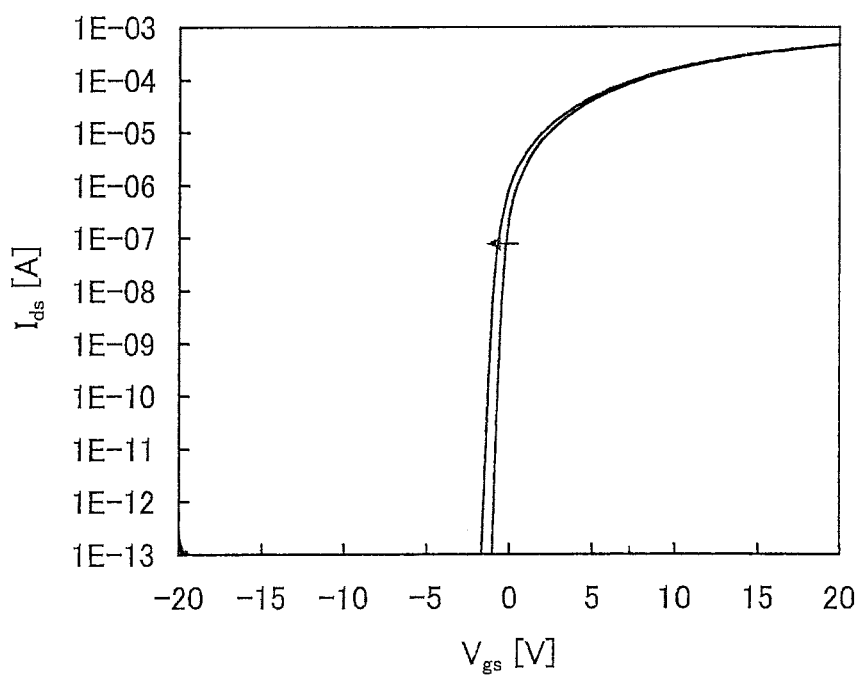
Figure 20A:
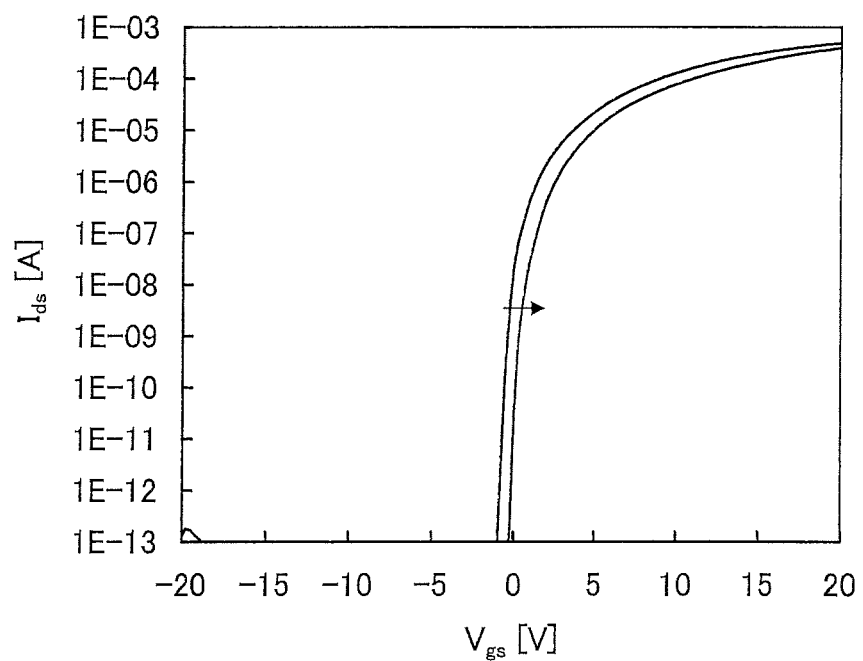
FIGS. 20A and 20B are graphs each showing the drain current of a transistor of Sample 2 after the BT stress test is performed.
Figure 20B:
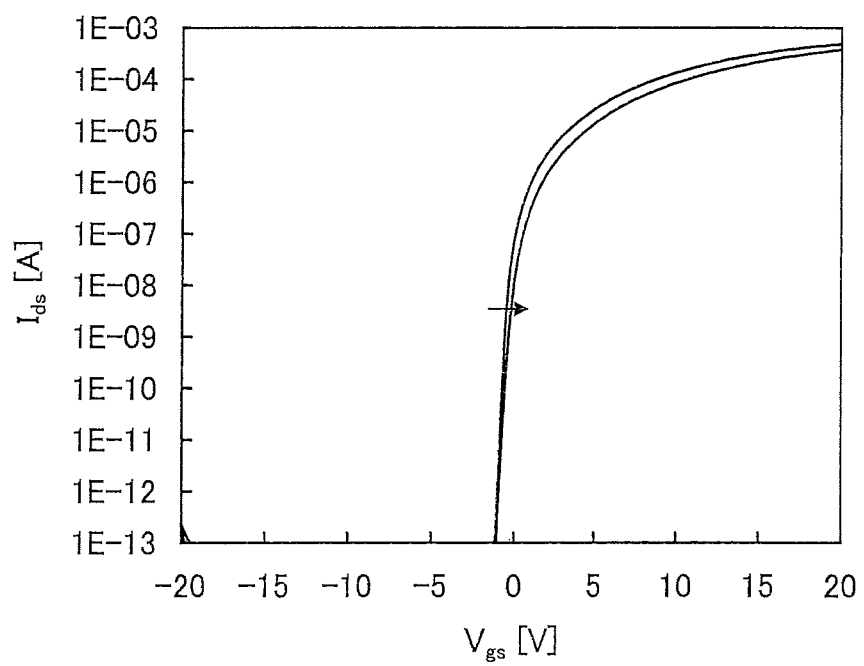

FIGS. 19A and 19B show a result of the positive BT stress test of Sample 1 and a result of the negative BT stress test of Sample 1, respectively. FIGS. 20A and 20B show a result of the positive BT stress test of Sample 2 and a result of the negative BT stress test of Sample 2, respectively.

The amounts of shift in the threshold voltage of Sample 1 due to the positive BT stress test and that due to the negative BT stress test were 1.80 V and −0.42 V, respectively. The amount of shift in the threshold voltage of Sample 2 due to the positive BT stress test and that due to the negative BT stress test were 0.79 V and 0.76 V, respectively. It is found that, in each of Sample 1 and Sample 2, the amount of shift in the threshold voltage between before and after the BT stress tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1 \times 10^{16}/cm^3$ and lower than or equal to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio, In:Sn:Zn=1:1:1, without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target in which In:Sn:Zn=1:1:1 [atomic ratio] was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 21:
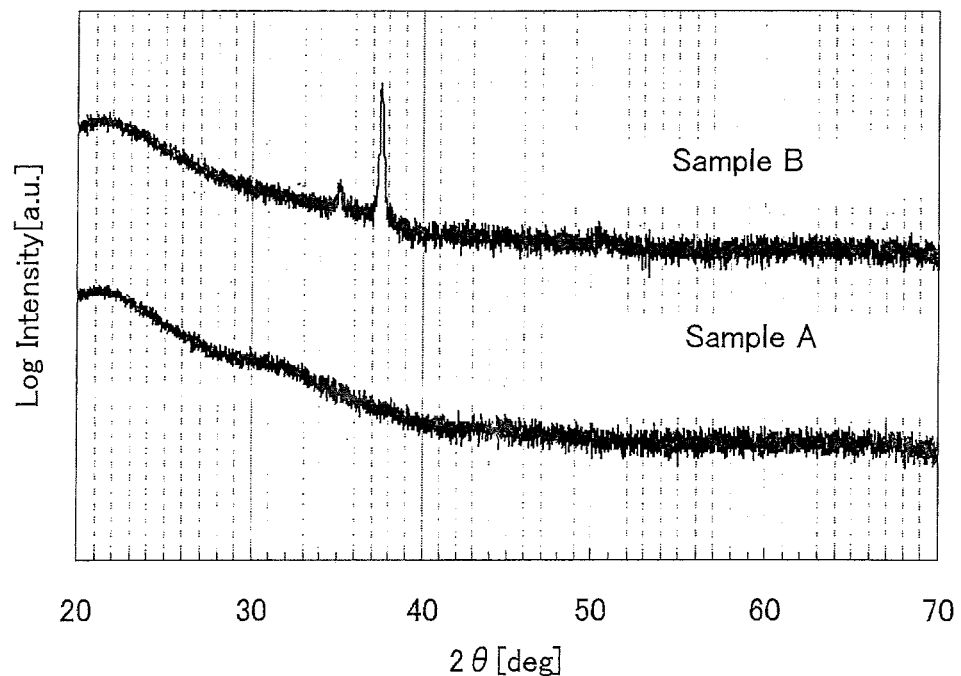
FIG. 21 is a graph showing XRD spectra of Sample A and Sample B.

FIG. 21 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen, a hydroxyl group, moisture, and the like, which are unfavorable impurities for an oxide semiconductor, from being included in the film or an effect of removing hydrogen, a hydroxyl group, moisture, and the like from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 22:
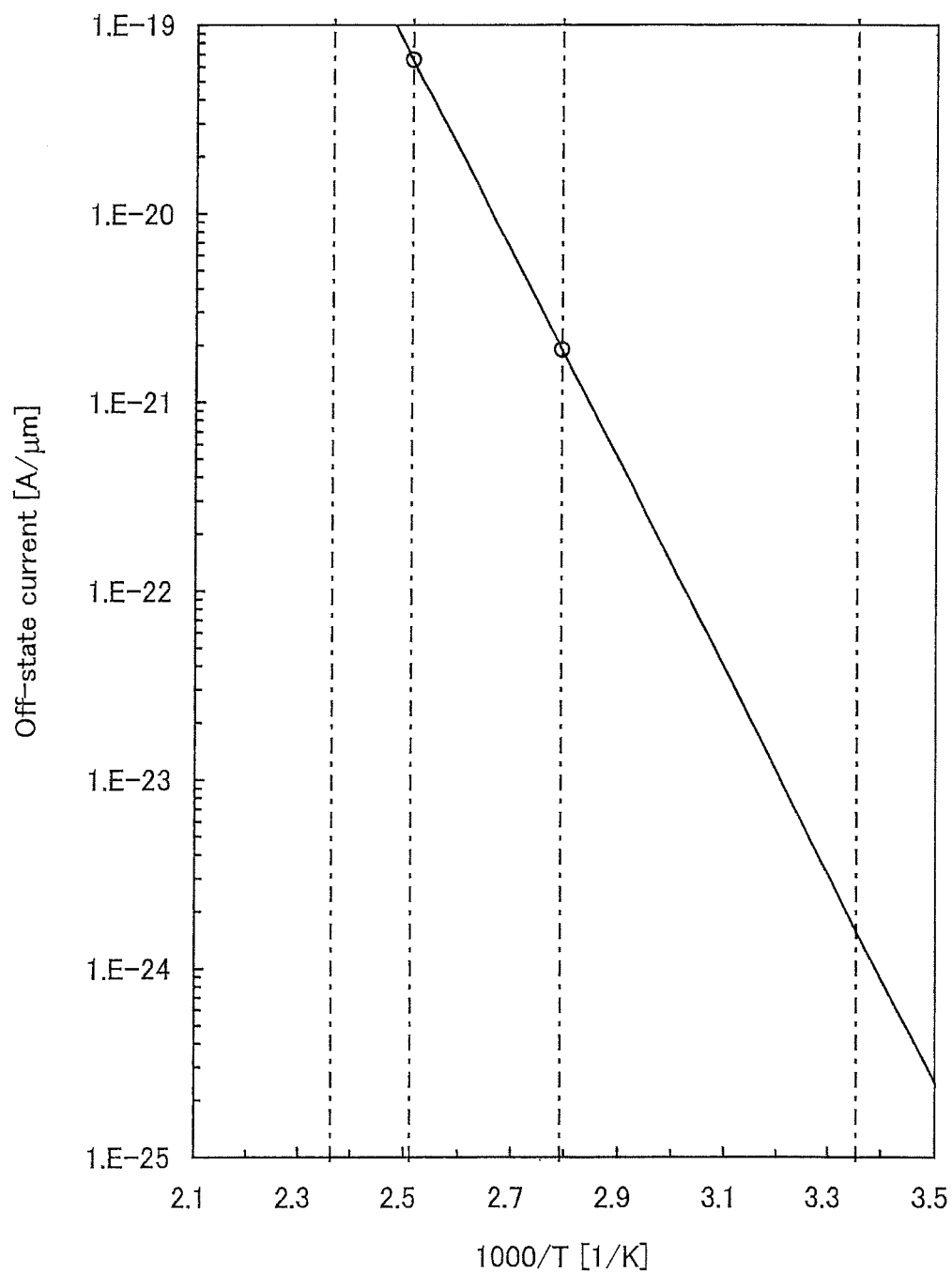
FIG. 22 is a graph showing a relation between the off-state current of a transistor and a substrate temperature in measurement.

FIG. 22 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 22, the off-state current was 0.1 aA/μm ($1 \times 10^{-19}$ A/μm) or smaller and 10 zA/μm ($1 \times 10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1 \times 10^{-22}$ A/μm) or smaller. Hence, the off-state current can be 1 aA/μm ($1 \times 10^{-18}$ A/μm) or smaller, 100 zA/μm ($1 \times 10^{-19}$ A/μm) or smaller, and 1 zA/μm ($1 \times 10^{-21}$ A/μm) or smaller at 125° C., 85° C., and room temperature, respectively. The above values of off-state currents are clearly much lower than that of the transistor using S1 as a semiconductor film.

Note that in order to prevent hydrogen, moisture, and the like from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen, moisture, and the like. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, $L_{ov}$ of 0 μm, and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as $L_{ov}$, and the width of a portion of the pair of electrodes, which does not overlap with an oxide semiconductor film, is referred to as dW.

Figure 23:
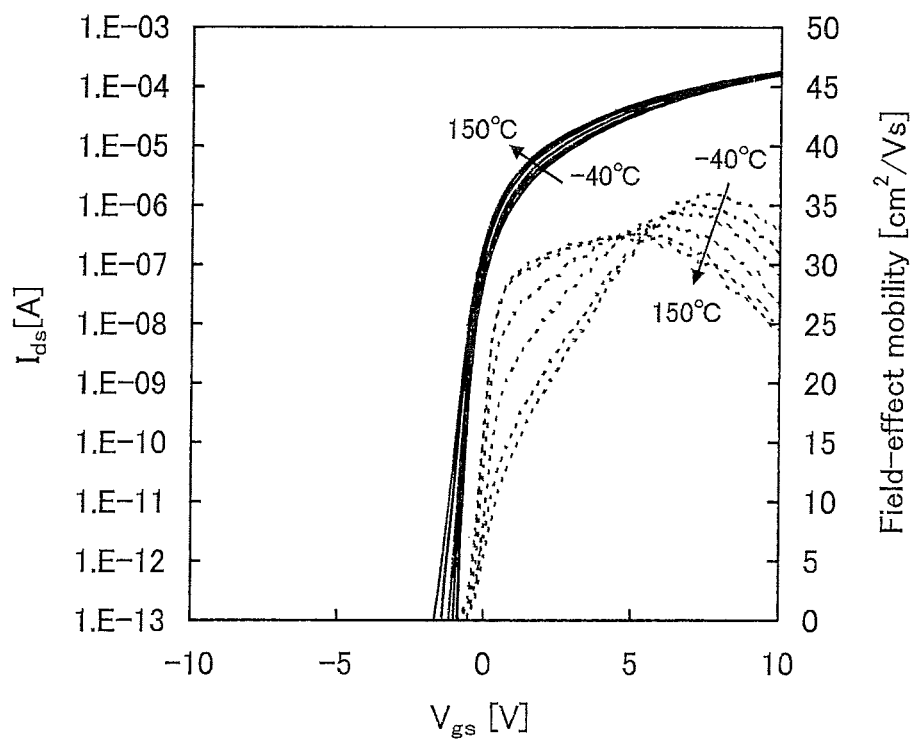
FIG. 23 is a graph showing the gate voltage dependence of drain current and field-effect mobility.
Figure 24:
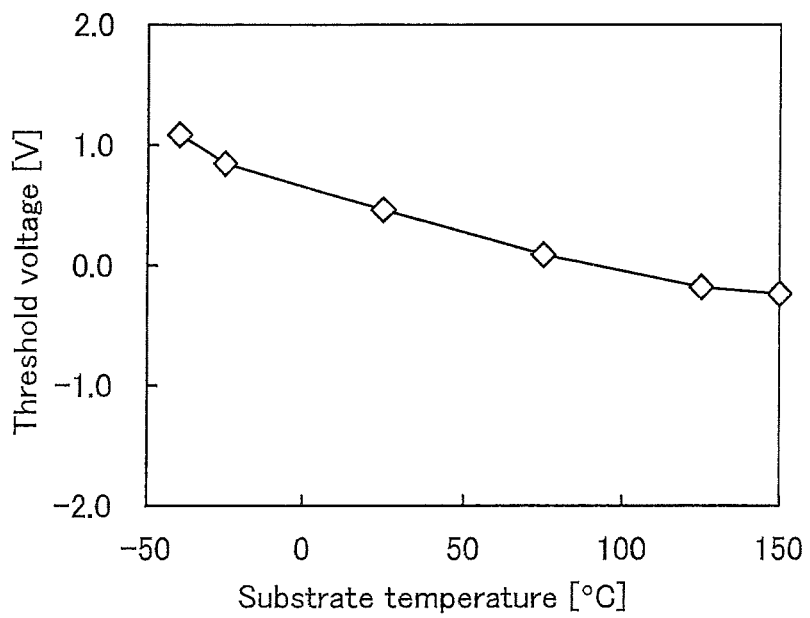
FIG. 24A is a graph showing a relation between the threshold voltage and the substrate temperature.
FIG. 24B is a graph showing a relation between the field-effect mobility and the substrate temperature.
Figure 24:
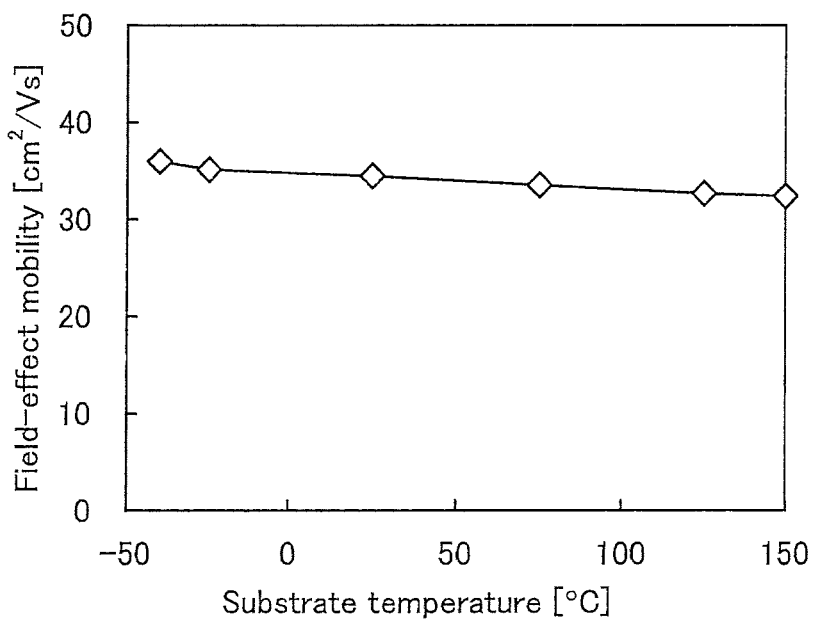

FIG. 23 shows the $V_{gs}$ dependence of $I_{ds}$ (a solid line) and field-effect mobility (a dotted line). FIG. 24A shows a relation between the threshold voltage and the substrate temperature, and FIG. 24B shows a relation between the field-effect mobility and the substrate temperature.

From FIG. 24A, it is found that the threshold voltage gets lower as the substrate temperature increases. Note that the threshold voltage is decreased from 1.09 V to −0.23 V in the range from −40° C. to 150° C.

From FIG. 24B, it is found that the field-effect mobility gets lower as the substrate temperature increases. Note that the field-effect mobility is decreased from 36 cm$^2$V/sec to 32 cm$^2$/Vsec in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm$^2$/Vs or higher, preferably 40 cm$^2$/Vs or higher, further preferably 60 cm$^2$/Vs or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be obtained without decreasing the operation speed even when a transistor including an oxide semiconductor is also provided in an integrated circuit formed using a silicon semiconductor.

This example can be implemented in appropriate combination with any of the above embodiments.

This application is based on Japanese Patent Application serial no. 2011-113995 filed with Japan Patent Office on May 20, 2011, the entire contents of which are hereby incorporated by reference.

What is claimed is:

1. A semiconductor device comprising:
   a level shifter;
   a first buffer; and
   a second buffer,
   wherein the first buffer comprises a first transistor and a second transistor connected in series,
   wherein the second buffer comprises a third transistor and a fourth transistor connected in series,
   wherein the level shifter comprises a fifth transistor, a sixth transistor, and a seventh transistor connected in series and an eighth transistor, a ninth transistor, and a tenth transistor connected in series,
   wherein a gate of the second transistor, a gate of the third transistor, and a gate of the eighth transistor are electrically connected to each other,
   wherein a gate of the first transistor, a gate of the fourth transistor, and a gate of the fifth transistor are electrically connected each other,
   wherein a gate of the sixth transistor and a gate of the seventh transistor are electrically connected to a connection portion of one of a source and a drain of the first transistor and one of a source and a drain of the second transistor, and
   wherein a gate of the ninth transistor and a gate of the tenth transistor are electrically connected to a connection portion of one of a source and a drain of the third transistor and one of a source and a drain of the fourth transistor, and
   wherein the first transistor, the second transistor, the third transistor, the fourth transistor, the seventh transistor, and the tenth transistor are n-channel transistors.

2. The semiconductor device according to claim 1, wherein each of the first transistor to the fourth transistor comprises an oxide semiconductor in a channel region.

3. The semiconductor device according to claim 2, wherein the oxide semiconductor comprises indium.

4. The semiconductor device according to claim 1, wherein the fifth transistor, the sixth transistor, the eighth transistor, and the ninth transistor are p-channel transistors.

5. The semiconductor device according to claim 1, wherein a first inverter comprises the sixth transistor and the seventh transistor.

6. The semiconductor device according to claim 1, wherein a second inverter comprises the ninth transistor and the tenth transistor.

7. The semiconductor device according to claim 1,
   wherein the other of the source and the drain of each of the first transistor and the third transistor is electrically connected to a wiring for supplying high power supply potential, and
   wherein the other of the source and the drain of each of the second transistor and the fourth transistor is electrically connected to a wiring for supplying low power supply potential.

8. A semiconductor device comprising:
   a level shifter;
   a first buffer;
   a second buffer;
   a first switch; and
   a second switch;
   wherein the first buffer comprises a first transistor and a second transistor connected in series,
   wherein the second buffer comprises a third transistor and a fourth transistor connected in series,
   wherein the level shifter comprises a fifth transistor, a sixth transistor, and a seventh transistor connected in series and an eighth transistor, a ninth transistor, and a tenth transistor connected in series, wherein a connection portion of one of a source and a drain of the sixth transistor and one of a source and a drain of the seventh transistor is electrically connected to a gate of the second transistor, a gate of the third transistor, and a gate of the eighth transistor via the first switch, wherein a connection portion of one of a source and a drain of the ninth transistor and one of a source and a drain of the tenth transistor is electrically connected to a gate of the first transistor, a gate of the fourth transistor, and a gate of the fifth transistor via the second switch, wherein a gate of the sixth transistor and a gate of the seventh transistor are electrically connected to a connection portion of one of a source and a drain of the first transistor and one of a source and a drain of the second transistor, wherein a gate of the ninth transistor and a gate of the tenth transistor are electrically connected to a connection portion of one of a source and a drain of the third transistor and one of a source and a drain of the fourth transistor, and wherein the first transistor, the second transistor, the third transistor, the fourth transistor, the seventh transistor, and the tenth transistor are n-channel transistors.

9. The semiconductor device according to claim 8, wherein each of the first transistor to the fourth transistor comprises an oxide semiconductor in a channel region.

10. The semiconductor device according to claim 9, wherein the oxide semiconductor comprises indium.

11. The semiconductor device according to claim 8, wherein the fifth transistor, the sixth transistor, the eighth transistor, and the ninth transistor are p-channel transistors.

12. The semiconductor device according to claim 8, wherein a first inverter comprises the sixth transistor and the seventh transistor.

13. The semiconductor device according to claim 8, wherein a second inverter comprises the ninth transistor and the tenth transistor.

14. The semiconductor device according to claim 8,
wherein the other of the source and the drain of each of the first transistor and the third transistor is electrically connected to a wiring for supplying high power supply potential, and
wherein the other of the source and the drain of each of the second transistor and the fourth transistor is electrically connected to a wiring for supplying low power supply potential.

15. A semiconductor device comprising:
a level shifter;
a first buffer;
a second buffer;
a first switch;
a second switch;
a first terminal;
a second terminal configured to receive an inverted signal of a signal input to the first terminal; and
a third terminal configured to receive a clock signal for controlling states of the first switch and the second switch, wherein the first buffer comprises a first transistor and a second transistor connected in series, wherein the second buffer comprises a third transistor and a fourth transistor connected in series, wherein the level shifter comprises a fifth transistor, a sixth transistor, and a seventh transistor connected in series and an eighth transistor, a ninth transistor, and a tenth transistor connected in series, wherein a connection portion of one of a source and a drain of the sixth transistor and one of a source and a drain of the seventh transistor is electrically connected to a gate of the second transistor, a gate of the third transistor, and a gate of the eighth transistor via the first switch, wherein a connection portion of one of a source and a drain of the ninth transistor and one of a source and a drain of the tenth transistor is electrically connected to a gate of the first transistor, a gate of the fourth transistor, and a gate of the fifth transistor via the second switch, wherein one of a source and a drain of the fifth transistor is electrically connected to the other of the source and the drain of the sixth transistor, wherein one of a source and a drain of the eighth transistor is electrically connected to the other of the source and the drain of the ninth transistor, wherein a gate of the sixth transistor and a gate of the seventh transistor are electrically connected to a connection portion of one of a source and a drain of the first transistor and one of a source and a drain of the second transistor, wherein a gate of the ninth transistor and a gate of the tenth transistor are electrically connected to a connection portion of one of a source and a drain of the third transistor and one of a source and a drain of the fourth transistor, and wherein the first transistor, the second transistor, the third transistor, the fourth transistor, the seventh transistor, and the tenth transistor are n-channel transistors.

16. The semiconductor device according to claim 15, wherein each of the first transistor to the fourth transistor comprises an oxide semiconductor in a channel region.

17. The semiconductor device according to claim 16, wherein the oxide semiconductor comprises indium.

18. The semiconductor device according to claim 15, wherein the fifth transistor, the sixth transistor, the eighth transistor, and the ninth transistor are p-channel transistors.

19. The semiconductor device according to claim 15, wherein a first inverter comprises the sixth transistor and the seventh transistor.

20. The semiconductor device according to claim 15, wherein a second inverter comprises the ninth transistor and the tenth transistor.

21. The semiconductor device according to claim 15,
wherein the other of the source and the drain of each of the first transistor and the third transistor is electrically connected to a wiring for supplying high power supply potential, and
wherein the other of the source and the drain of each of the second transistor and the fourth transistor is electrically connected to a wiring for supplying low power supply potential.

* * * * *

UNITED STATES PATENT AND TRADEMARK OFFICE
CERTIFICATE OF CORRECTION

PATENT NO. : 9,048,825 B2
APPLICATION NO. : 14/211426
DATED : June 2, 2015
INVENTOR(S) : Tatsuji Nishijima It is certified that error appears in the above-identified patent and that said Letters Patent is hereby corrected as shown below:

In the Specification:

Column 2, Line 37; Change "tetminal," to --terminal,--.

Column 3, Line 12; Change "fanned" to --formed--.

Column 7, Line 7; Change "signal 51" to --signal S1--.

Column 17, Line 43; Change "film" to --film.--.

Column 19, Line 26; Change "1 nMO$_3$ (ZnO)$_m$" to --InMO$_3$(ZnO)$_m$--.

Column 19, Line 27; Change "and in is" to --and m is--.

Column 20, Line 14; Change "0.3 tun," to --0.3 nm,--.

Column 23, Line 38; Change "(in is" to --(m is--.

Column 31, Line 67; Change "tune" to --time--.

Column 35, Line 62; Change "40 nm" to --40 nm.--.

Column 37, Line 52; Change "10V." to --10 V.--.

Column 38, Line 22; Change "manner" to --manner:--.

Column 40, Line 65; Change "S1" to --Si--.

Signed and Sealed this
Eighth Day of December, 2015

Michelle K. Lee
*Director of the United States Patent and Trademark Office*